US007283016B2

(12) United States Patent
Haruta et al.

(10) Patent No.: US 7,283,016 B2
(45) Date of Patent: Oct. 16, 2007

(54) BALANCED ACOUSTIC WAVE FILTER AND ACOUSTIC WAVE FILTER

(75) Inventors: Kazumasa Haruta, Yasu (JP); Katsuhito Kuroda, Hakusa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 11/615,130

(22) Filed: Dec. 22, 2006

(65) Prior Publication Data

US 2007/0103254 A1 May 10, 2007

Related U.S. Application Data

(63) Continuation of application No. PCT/JP2005/010911, filed on Jun. 15, 2005.

(30) Foreign Application Priority Data

Jun. 30, 2004 (JP) ............................ 2004-193812

(51) Int. Cl.
*H03H 9/72* (2006.01)
*H03H 9/64* (2006.01)

(52) U.S. Cl. ....................... 333/133; 333/193; 333/195

(58) Field of Classification Search ................ 333/193, 333/195, 133

See application file for complete search history.

(56) References Cited

U.S. PATENT DOCUMENTS 5,506,552 A 4/1996 Seki et al.
5,790,000 A * 8/1998 Dai et al. .................. 333/193
6,388,545 B1 * 5/2002 Kawachi et al. ............ 333/193
6,469,593 B2 * 10/2002 Nishizawa et al. ......... 333/133
6,815,870 B2 * 11/2004 Shibata et al. .......... 310/313 R
7,053,733 B2 * 5/2006 Yata et al. .................. 333/195
2002/0017969 A1 2/2002 Takamine
2002/0145361 A1 10/2002 Shibata et al.
2003/0058066 A1 3/2003 Taniguchi et al.
2004/0080385 A1 * 4/2004 Takamine et al. ........... 333/195
2004/0196119 A1 * 10/2004 Shibahara et al. .......... 333/193
2004/0207491 A1 10/2004 Nakaya et al.

FOREIGN PATENT DOCUMENTS

JP 63-111713 * 5/1988
JP 5-110377 * 4/1993 ................ 333/193

(Continued)

OTHER PUBLICATIONS

Official Communication for PCT Application No. PCT/JP2005/010911; mailed Oct. 25, 2005.

*Primary Examiner*—Barbara Summons
(74) *Attorney, Agent, or Firm*—Keating & Bennett, LLP

(57) ABSTRACT

In an acoustic wave filter, first and second filter elements are connected between an unbalanced terminal and first and second balanced terminals on an acoustic wave substrate. The filter elements are longitudinally-coupled surface wave filters including at least three IDTs. One end of the IDTs is mutually connected and is connected to the unbalanced terminal. The other ends of the IDTs are connected by a second connecting line so as to define an unbalanced-side grounded portion. Grounded ends of the IDTs are connected to each other by a first connecting line so as to define a common midpoint grounded portion. The common midpoint grounded portion and the unbalanced-side grounded portion are electrically separated from each other.

15 Claims, 16 Drawing Sheets

FOREIGN PATENT DOCUMENTS

| | | | |
|---|---|---|---|
| JP | 05-167387 | A | 7/1993 |
| JP | 07-176979 | A | 7/1995 |
| JP | 2000-049565 | A | 2/2000 |
| JP | 2000-138553 | A | 5/2000 |
| JP | 2001-358556 | A | 12/2001 |
| JP | 2002-141771 | A | 5/2002 |
| JP | 2002-359537 | A | 12/2002 |
| JP | 2003-087081 | A | 3/2003 |
| JP | 2003-124782 | A | 4/2003 |
| JP | 2003-179462 | A | 6/2003 |
| JP | 2004-007713 | A | 1/2004 |
| JP | 2004-088551 | A | 3/2004 |
| JP | 2004-96244 | * | 3/2004 |
| JP | 2004-304513 | A | 10/2004 |

* cited by examiner

BALANCED ACOUSTIC WAVE FILTER AND ACOUSTIC WAVE FILTER

BACKGROUND OF THE INVENTION

1. Field of the Invention

The present invention relates to an acoustic wave filter including a plurality of acoustic wave elements connected to each other and an acoustic wave filter device. More specifically, the present invention relates to a midpoint-grounded balanced acoustic wave filter having a balance-unbalance converting function and an acoustic wave filter device.

2. Description of the Related Art

Conventionally, various surface acoustic wave (SAW) filters have been used as band-pass filters for communication apparatuses, such as mobile phones. In particular, a SAW filter used in an RF (radio frequency) stage of a mobile phone is required to have a balance-unbalance converting function. When having the balance-unbalance converting function, a SAW filter does not need to include a balun functioning as a balance-unbalance converting element. Accordingly, the mobile phone or other suitable device can be miniaturized.

Japanese Unexamined Patent Application Publication No. 2004-88551 (Patent Document 1) discloses an example of a midpoint-grounded balanced SAW filter having a balance-unbalance converting function. FIG. 24 is a schematic plan view showing the SAW filter described in Patent Document 1, and FIG. 25 shows the circuit configuration thereof.

As shown in FIG. 24, a SAW filter 200 includes a surface wave substrate 301. First and second SAW filter elements 201 and 202 and first and second SAW resonators 203 and 204 are disposed on the surface wave substrate 301. As shown in FIG. 25, the first filter element 201 is a longitudinally-coupled SAW filter element including IDTs (interdigital transducers) 205 to 207 and reflectors 208 and 209 aligned in a propagation direction of surface waves. The filter element 202 has the same configuration, including IDTs 210 to 212 and reflectors 213 and 214. Note that the phase of the second filter element 202 is 180 degrees different from that of the first filter element 201.

The center IDT 206 of the first filter element 201 and the center IDT 211 of the second filter element 202 connect to an unbalanced terminal 215. One end of the IDTs 205 and 207 connect to a first balanced terminal 216 via the SAW resonator 203. On the other hand, one end of the outer IDTs 210 and 212 of the second filter element 202 connect to a second balanced terminal 217 via the SAW resonator 204. With this configuration, the SAW filter 200 functions as a balanced SAW filter including the unbalanced terminal 215 and the first and second balanced terminals 216 and 217.

In the first and second filter elements, the ends opposite to the ends connected to the unbalanced terminal 215 of the IDTs 206 and 211 are grounded. As shown in FIG. 24, the IDTs 206 and 211 connect to electrode pads 302 and 303 provided on the surface wave substrate 301, respectively. The electrode pads 302 and 303 are electrode pads connected to a ground potential.

During manufacturing, metallic bumps are provided on the electrode pads 302 and 303, and the metallic bumps are electrically connected to an electrode land connecting to a ground potential on a package side. Accordingly, the electrode pads 302 and 303, that is, the grounded ends of the IDTs 206 and 211, are mutually connected on the electrode land connecting to the ground potential on the package side.

On the other hand, the ends opposite to the ends connected to the balanced signal terminal 216 of the IDTs 205 and 207 of the first filter element are also grounded. That is, in FIG. 24, the grounded end of the IDT 205 is electrically connected to an electrode pad 311. In addition, the IDT 207 is electrically connected to an electrode pad 312. The electrode pads 311 and 312 are electrode pads connected to the ground potential.

Likewise, on the side of the second filter element 202, the ends opposite to the ends connected to the balanced signal terminal 217 of the IDTs 210 and 212 are grounded. More specifically, as shown in FIG. 24, the grounded end of the IDT 210 is connected to the electrode pad 312, whereas the grounded end of the IDT 212 is connected to an electrode pad 313. Similar to the above-described electrode pads 302 and 303, the electrode pads 311 to 313 are connected to an electrode land that is provided on the package substrate and that is connected to the ground potential. That is, the electrode pads 311 to 313 are mutually connected as shown in the package substrate.

The SAW filter 200 is mounted on the package substrate by a face-down method. In this case, metallic bumps are provided on a plurality of electrode pads including the above-described electrode pads 302, 303, and 311 to 313. Then, the SAW filter 200 is mounted on the package substrate such that the surface on which the metallic bumps are provided is a lower surface, so that the metallic bumps enable the electrode pads 302, 303, and 311 to 313 to be connected to the electrode lands on the package substrate.

Since the above-described SAW filter 200 is assembled using a face-down method and does not need to include a balun because of having a balance-unbalance converting function, the SAW filter 200 can be miniaturized, so that the RF stage including the SAW filter 200 can also be miniaturized.

However, when the SAW filter 200 is actually used as a balanced SAW filter having a balance-unbalance converting function while being mounted on the package substrate as described above, out-of-band attenuation is not sufficient.

SUMMARY OF THE INVENTION

To overcome the problems described above, preferred embodiments of the present invention provide a further miniaturized balanced acoustic wave filter having efficiently improved out-of-band attenuation, thus, having a favorable filter characteristic, and also provide an acoustic wave filter device including the acoustic wave filter.

According to a preferred embodiment of the present invention, a balanced acoustic wave filter includes an unbalanced terminal and first and second balanced terminals. The filter includes an acoustic wave substrate, a first longitudinally-coupled filter element that is located on the acoustic wave substrate and that includes at least three IDTs connected between the unbalanced terminal and the first balanced terminal, a second longitudinally-coupled filter element that is located on the acoustic wave substrate and that includes at least three IDTs connected between the unbalanced terminal and the second balanced terminal through which a signal of an opposite phase to that in the first balanced terminal of the first filter element flows, a first connecting line that connects a grounded end of the IDT connected to the first balanced terminal of the first filter element to a grounded end of the IDT connected to the second balanced terminal of the second filter element so as to define a common midpoint grounded portion and that is provided on the acoustic wave substrate, and a second connecting line that connects grounded ends of the IDTS connected to the unbalanced terminal in the first filter element to grounded ends of the IDTs connected to the unbalanced terminal in the second filter element so as to define an unbalanced-side grounded portion and that is provided on the acoustic wave substrate. The common midpoint grounded portion and the unbalanced-side grounded portion are electrically separated from each other on the acoustic wave substrate.

According to another preferred embodiment of the present invention, a balanced acoustic wave filter includes an acoustic wave substrate, a first longitudinally-coupled filter element that is disposed on the acoustic wave substrate and that includes an unbalanced terminal, first and second balanced terminals, and at least three IDTs connected between the unbalanced terminal and the first and second balanced terminals, a second longitudinally-coupled filter element that includes third and fourth balanced terminals connected to the first and second balanced terminals of the first filter element, fifth and sixth balanced terminals, and a plurality of IDTs connected between the third and fourth balanced terminals and the fifth and sixth balanced terminals, a first connecting line that connects grounded ends of the IDTs connected to the first and second balanced terminals of the first filter element to grounded ends of the IDTs connected to the third and fourth balanced terminals of the second filter element, that defines a common midpoint grounded portion, and that is provided on the acoustic wave substrate, and a second connecting line that is connected to the grounded ends of the IDTs connected to the unbalanced terminal of the first filter element and that is provided on the acoustic wave substrate so as to define an unbalanced-side grounded portion. The common midpoint grounded portion and the unbalanced-side grounded portion are electrically separated from each other on the acoustic wave substrate.

According to another preferred embodiment of the present invention, the balanced acoustic wave filter further includes a third connecting line that connects the unbalanced terminal to at least one of the IDTs connected to the unbalanced terminal and that crosses the first connecting line on the acoustic wave substrate, and interlayer insulating films disposed between the first and third connecting lines at intersections of the first and third connecting lines.

According to another preferred embodiment of the present invention, the balanced acoustic wave filter further includes a package. The package includes a first electrode land connected to the common midpoint grounded portion by a bump and a second electrode land connected to the unbalanced-side grounded portion by a bump. The first and second electrode lands are separated from each other on the package.

According to another preferred embodiment of the balanced acoustic wave filter according to the present invention, a surface acoustic wave is used as the acoustic wave, so that a balanced surface acoustic wave filter is provided. In the present invention, an "acoustic wave" includes not only a surface acoustic wave, but also other types of acoustic waves, such as a boundary acoustic wave.

According to another preferred embodiment of an acoustic wave filter device according to the present invention, a first balanced acoustic wave filter as the balanced acoustic wave filter according to a preferred embodiment of the present invention and a second balanced acoustic wave filter as the balanced acoustic wave filter according to another preferred embodiment of the present invention are disposed on an acoustic wave substrate. A center frequency of the first balanced acoustic wave filter is different from a center frequency of the second balanced acoustic wave filter. A common midpoint grounded portion of the first balanced acoustic wave filter and a common midpoint grounded portion of the second balanced acoustic wave filter are mutually connected, and an unbalanced-side grounded portion of the first balanced acoustic wave filter and an unbalanced-side grounded portion of the second balanced acoustic wave filter are mutually connected. The mutually connected common midpoint grounded portions and the mutually connected unbalanced-side grounded portions are electrically separated from each other on the acoustic wave substrate.

According to another preferred embodiment of the acoustic wave filter device according to the present invention, a first balanced acoustic wave filter as the balanced acoustic wave filter according to a preferred embodiment of the present invention and a second balanced acoustic wave filter as the balanced acoustic wave filter according to a preferred embodiment of the present invention are disposed on an acoustic wave substrate. A center frequency of the first balanced acoustic wave filter is different from a center frequency of the second balanced acoustic wave filter. A common midpoint grounded portion of the first balanced acoustic wave filter and a common midpoint grounded portion of the second balanced acoustic wave filter are mutually connected. The mutually connected common midpoint grounded portions, an unbalanced-side grounded portion of the first balanced acoustic wave filter, and an unbalanced-side grounded portion of the second balanced acoustic wave filter are electrically separated from each other on the acoustic wave substrate. The acoustic wave filter device further includes a package, the package including a first electrode land connected to the common midpoint grounded portion by a bump, a second electrode land connected to the unbalanced-side grounded portion of the first balanced acoustic wave filter by a bump, and a third electrode land connected to the unbalanced-side grounded portion of the second balanced acoustic wave filter by a bump. The first electrode land, the second electrode land, and the third electrode land are separated from each other on the package.

According to another preferred embodiment of the acoustic wave filter device according to the present invention, the acoustic wave filter device defines a duplexer or a multi-band filter.

In the balanced acoustic wave filter according to preferred embodiments of the present invention, the first connecting line connects the grounded end of the IDT connected to the first balanced terminal of the first filter element to the grounded end of the IDT connected to the second balanced terminal of the second filter element so as to define the common midpoint grounded portion, the second connecting line connects the grounded ends of the IDTS connected to the unbalanced terminal in the first filter element to the grounded ends of the IDTs connected to the unbalanced terminal in the second filter element so as to define the unbalanced-side grounded portion, and the common midpoint grounded portion and the unbalanced-side grounded portion are electrically separated from each other on the acoustic wave substrate. Therefore, in the midpoint-grounded balanced acoustic wave filter having a balance-unbalance converting function, out-of-band attenuation is effectively improved. The reasons are as follows. That is, ground current in the midpoint-grounded balanced acoustic wave filter flows only in the ground side of the IDT connected to the unbalanced terminal. That is, when the grounded ends of the IDTs connected to the balanced terminal are connected to each other and when the midpoint thereof is grounded, the two IDTs are connected in series between two balanced signal terminals. In this case, voltages of the same magnitude and opposite phases are generated in the two IDTs on the balanced side, current flows from the balanced terminal of one of the IDTs to the balanced terminal of the other IDT, and currents of opposite directions flow into the midpoint grounded portion and cancel each other.

However, in the configuration in which the first and second filter elements are connected, the midpoint grounded portions of the IDTs of the two filter elements cannot usually be combined on an acoustic wave substrate. Therefore, the midpoint grounded portions are mutually connected on the ground electrode side on the package substrate, as described in Patent Document 1. However, achieving miniaturization is difficult because the SAW substrate is connected to the package substrate by bumps, and thus, the distance between the ground electrode on the package substrate and the common midpoint grounded portion of the IDTs on the SAW substrate is large, the area of bumps is large, and the distances between the bumps are large. Furthermore, out-of-band attenuation disadvantageously deteriorates.

That is, in an electrode land of the packaged substrate, current due to surface acoustic waves flows from a connecting point of a bump connected to a grounded potential to a connecting point of a bump connected to another grounded potential, an electrical midpoint exists at a point between two bump connecting points of an electrode land on the package substrate, and the impedance between the point and the midpoint grounded portion of the IDTs of the first and second filter elements increases.

Accordingly, balance and out-of-band attenuation deteriorate.

On the other hand, according to preferred embodiments of the present invention, common connection of the common midpoint grounded portion is achieved on the acoustic wave substrate. Thus, an electrical midpoint exists on the acoustic wave substrate, the distance between the common midpoint grounded portion and the electrical midpoint is reduced, the impedance between them is reduced, balance is improved, and out-of-band attenuation of the filter is improved. That is, the attenuation on a high-frequency side of a pass band is improved by connecting the separated common midpoint grounded portion and the unbalanced-side grounded portion by impedance or inductance. The inductance value in this case is not limited, but may be about 0.1 nH to about 10 nH. In addition, on the acoustic wave substrate, the grounded ends of the IDTs of the first filter element connected to the unbalanced terminal and the grounded ends of the IDTs of the second filter element connected to the unbalanced terminal are mutually connected by the second connecting line so that the unbalanced-side grounded portion is provided. That is, the ground on the unbalanced side is shared on the acoustic wave substrate. Accordingly, flow of ground current can be appropriately controlled, whereby out-of-band attenuation is expanded.

In the balanced acoustic wave filter according to preferred embodiments of the present invention, the first filter element that includes the unbalanced terminal and the first and second balanced terminals and that has a balance-unbalance converting function, and the second filter element including the third and fourth balanced terminals connected to the first and second balanced terminals of the first filter element and the fifth and sixth balanced terminals are provided on the acoustic wave substrate. The first connecting line connects the grounded ends of the IDTs connected to the first and second balanced terminals to the grounded ends of the IDTs connected to the third and fourth balanced terminals of the second filter element, so as to define the common midpoint grounded portion. The second connecting line is connected to the grounded ends of the IDTs connected to the unbalanced terminal of the first filter element so that the unbalanced-side grounded portion is provided. The common midpoint grounded portion and the unbalanced-side grounded portion are electrically separated from each other. In that case, the acoustic wave filter is miniaturized and out-of-band attenuation is effectively expanded, so that a favorable filter characteristic is obtained.

In preferred embodiments of the present invention, the third connecting line connecting at least one of the IDTs connected to the unbalanced terminal to the unbalanced terminal crosses the first connecting line on the acoustic wave substrate. At the intersections therebetween, interlayer insulating films are disposed between the first and third connecting lines. In that case, the interlayer insulating films reliably prevent short-circuits between the first and third connecting lines. Also, since the first and third connecting lines cross each other, the length of the first and third connecting lines is shortened, and connecting lines and electrodes are provided at high density on the acoustic wave substrate. Accordingly, the acoustic wave filter is further miniaturized.

In preferred embodiments of the present invention, the package includes the first electrode land connected to the common midpoint grounded portion by a bump and the second electrode land connected to the unbalanced-side grounded portion by a bump. The first and second electrode lands are separated from each other on the package. In that case, a configuration in which the balanced acoustic wave filter element is connected to the package by bumps is obtained. In this balanced acoustic wave filter, the common midpoint grounded portion is provided on the acoustic wave substrate and out-of-band attenuation is expanded. Therefore, a favorable filter characteristic is achieved in a miniaturized configuration in which the acoustic wave filter is mounted on the package substrate by bump bonding in a face-down method. When surface acoustic waves are used as acoustic waves, a miniaturized balanced surface acoustic wave filter having expanded out-of-band attenuation is provided according to preferred embodiments of the present invention.

In the acoustic wave filter device, the first and second balanced acoustic wave filters as the balanced acoustic wave filters according to preferred embodiments of the present are provided on the acoustic wave substrate, the center frequency of the first balanced acoustic wave filter is different from the center frequency of the second balanced acoustic wave filter, the common midpoint grounded portions of both of the filters are mutually connected, and the unbalanced-side grounded portions of the both filters are mutually connected. In this case, a plurality of acoustic wave filters having a balance-unbalance converting function can be configured into a chip component using an acoustic wave substrate according to preferred embodiments of the present invention. Accordingly, a miniaturized duplexer or a multi-band filter having expanded out-of-band attenuation is provided.

In the acoustic wave filter device, the first and second balanced acoustic wave filters as the balanced acoustic wave filters according to preferred embodiments the present are provided on the acoustic wave substrate, the center frequency of the first balanced acoustic wave filter is different from the center frequency of the second balanced acoustic wave filter, the common midpoint grounded portions of both of the filters are mutually connected, and the unbalanced-side grounded portions of the both filters are mutually connected. Furthermore, the acoustic wave filter device includes the package including the first to third electrode lands, the common midpoint grounded portion is connected to the first electrode land by a bump, the unbalanced-side grounded portion of the first balanced acoustic wave filter is connected to the second electrode land by a bump, the unbalanced-side grounded portion of the second balanced acoustic wave filter is connected to the third electrode land by a bump, and the first to third electrode lands are separated from each other. In this case, a plurality of acoustic wave filters having a balance-unbalance converting function can be configured into a chip component including an acoustic wave substrate. Furthermore, a miniaturized acoustic wave filter device in which the acoustic wave filter chip is connected to the package substrate by bumps is provided. In this acoustic wave filter device, the first to third electrode lands are separated from each other on the package, so that isolation between the first and second balanced acoustic wave filters is improved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, the present invention is clarified by describing specific preferred embodiments of the present invention.

Figure 1:
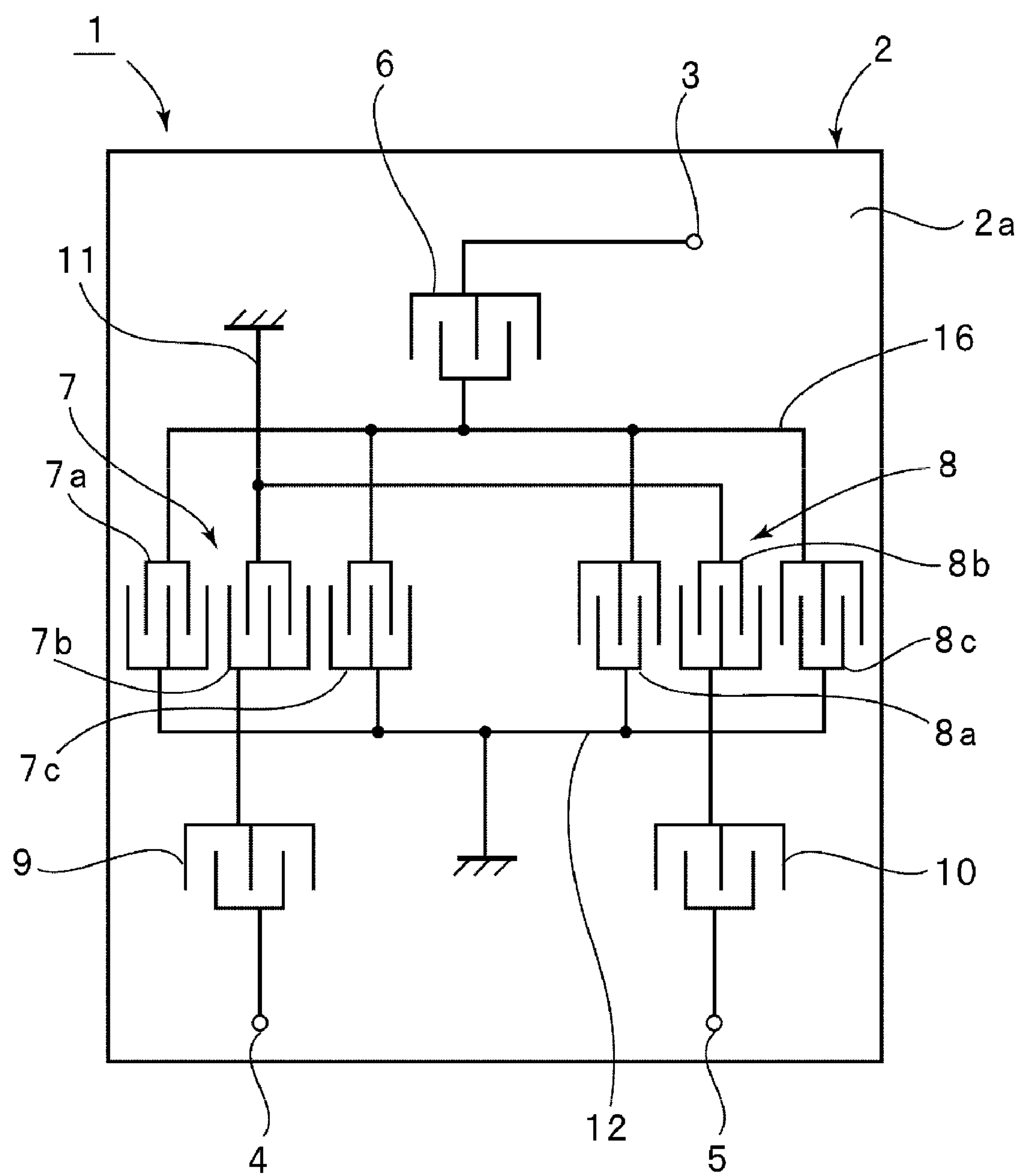
FIG. 1 is a schematic plan view showing a circuit configuration of a surface acoustic wave (SAW) filter according to a first preferred embodiment of the present invention.
Figure 2:
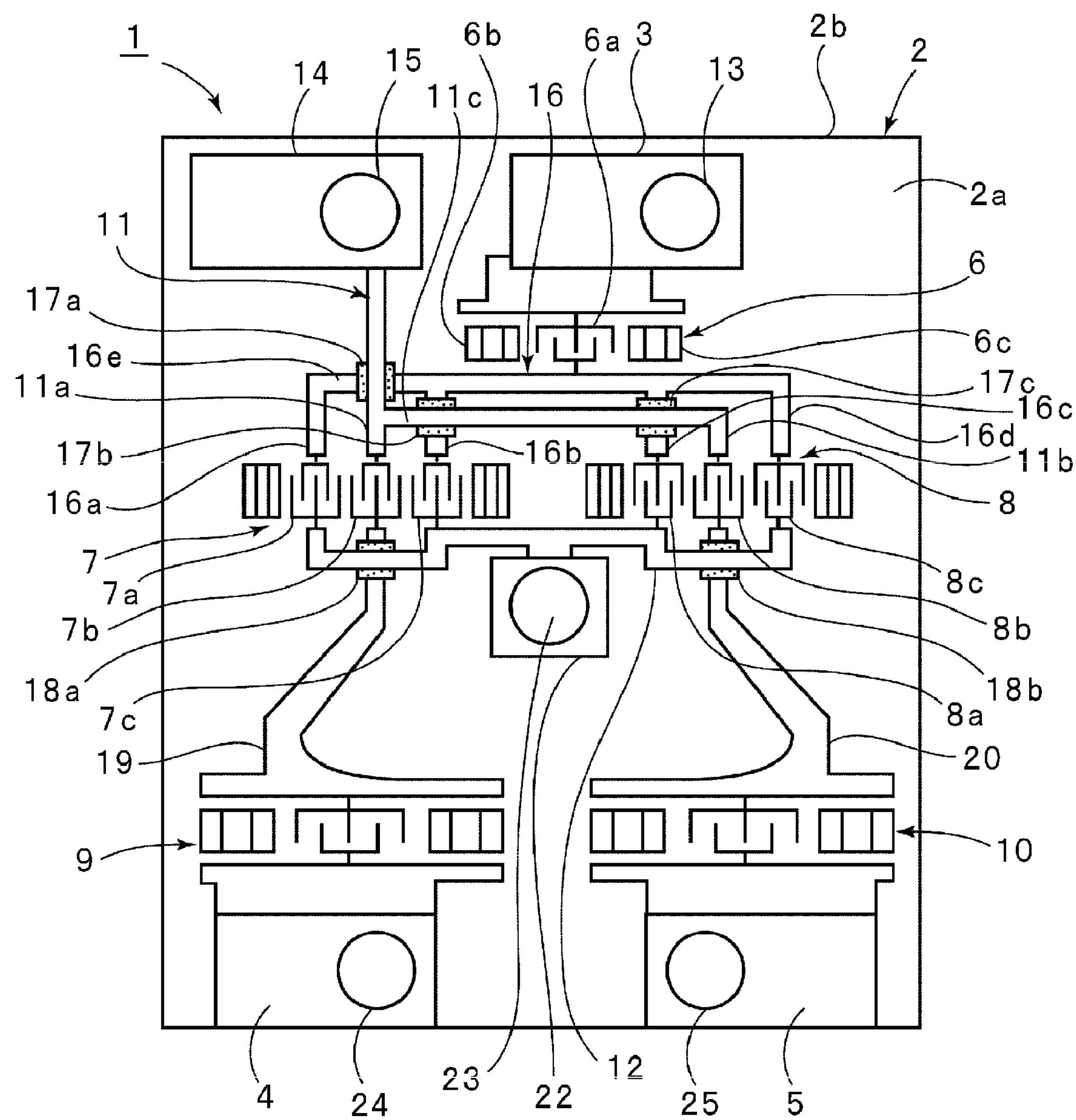
FIG. 2 is a schematic plan view showing an electrode configuration of the SAW filter according to the first preferred embodiment of the present invention.

FIG. 1 is a schematic plan view illustrating a circuit configuration of a surface acoustic wave (SAW) filter according to a first preferred embodiment of the present invention. FIG. 2 is a schematic plan view showing a specific electrode configuration thereof.

As shown in FIG. 1, a SAW filter 1 includes a SAW substrate 2 defining an acoustic wave substrate. The SAW substrate 2 is preferably made of piezoelectric single crystal or piezoelectric ceramic and is preferably rectangular-shaped in this preferred embodiment. Various electrodes and connecting lines that are described below are provided on one principal surface 2*a* of the SAW substrate 2, so that the circuit configuration shown in FIG. 1 is achieved.

As shown in FIG. 1, the SAW filter 1 includes an unbalanced terminal 3 and first and second balanced terminals 4 and 5, thereby having a balance-unbalance converting function.

A single-port SAW resonator 6 is connected to the unbalanced terminal 3. First and second filter elements 7 and 8 are connected in the subsequent stage of the one-port SAW resonator 6. The first and second filter elements 7 and 8 are 3-IDT longitudinally-coupled SAW filter elements including three IDTs 7*a*, 7*b*, and 7*c* or 8*a*, 8*b*, and 8*c*.

One end of the outer IDTs 7*a* and 7*c* of the first filter element 7 is connected to the unbalanced terminal 3 via the SAW resonator 6. One end of the center IDT 7*b* is connected to the first balanced terminal 4 via a SAW resonator 9.

Likewise, one end of the outer IDTs 8*a* and 8*c* of the second filter element 8 is connected to the unbalanced terminal 3 via the SAW resonator 6. One end of the center IDT 8*b* is connected to the second balanced terminal 5 via a SAW resonator 10.

The grounded end opposite to the ends connected to the first and second balanced terminals 4 and 5 of the IDTs 7*b* and 8*b* are mutually connected by a first connecting line 11, so that a common midpoint grounded portion is provided.

On the other hand, the ends opposite to the ends connected to the unbalanced terminal of the IDTs 7*a*, 7*c*, 8*a*, and 8*c* are mutually connected by a second connecting line 12, so that an unbalanced-side grounded portion is provided.

One of the unique characteristics of the SAW filter 1 according to this preferred embodiment is that the common midpoint grounded portion and the unbalanced-side grounded portion are provided as described above, and that the common midpoint grounded portion and the unbalanced-side grounded portion are separated from each other on the SAW substrate 2. This is specifically described below with reference to FIG. 2.

In FIG. 2, elements that are the same as those in FIG. 1 are denoted by the same reference numerals, and the description that has been made with reference to FIG. 1 is appropriately omitted.

As shown in FIG. 2, an electrode pad corresponding to the unbalanced terminal 3 is disposed on the principal surface 2*a* of the SAW substrate 2, and a bump 13 is connected to the electrode pad.

An electrode pad 14 is disposed at the end of the first connecting line provided on the SAW substrate 2. A bump 15 is connected to the electrode pad 14. The electrode pad 14 is connected to an electrode land connecting to a ground potential on a package side (described below) via the bump 15.

Although not shown in FIG. 1, each of the SAW resonator 6, the filter elements 7 and 8, and the SAW resonators 9 and 10 includes a pair of reflectors disposed on the outer sides in the propagation direction of surface waves, as shown in FIG. 2. For example, in the SAW resonator 6, reflectors 6*b* and 6*c* are provided on both sides of an IDT 6*a*. Note that the reflectors are not shown in FIG. 1 for simple illustration.

Likewise, illustration of reflectors is omitted as necessary in circuit diagrams of other preferred embodiments described below.

Referring to FIG. 2, a third connecting line 16 is provided to connect the IDT 6*a* of the SAW resonator 6 to the IDTs 7*a*, 7*c*, 8*a*, and 8*c* of the filter elements 7 and 8.

In the filter elements 7 and 8, the first connecting line 11 is connected to the center IDTs 7*b* and 8*b*, and the third connecting line 16 is connected to the IDTs 7*a*, 7*c*, 8*a*, and 8*c* on the both sides. The first connecting line 11 is connected to the electrode pad 14, which is disposed on the side of one edge 2*b* of the SAW substrate 2 with respect to the filter elements 7 and 8. The third connecting line 16 is connected to the unbalanced terminal 3 disposed on the side of the edge 2*b* via the SAW resonator 6. Therefore, the first connecting line 11 and the third connecting line 16 inevitably cross each other.

In this preferred embodiment, interlayer insulating films 17*a* to 17*c* are provided at intersections between the first connecting line 11 and the third connecting line 16 in order to prevent a short-circuit between the two lines. That is, the interlayer insulating films 17*a* to 17*c* are provided at the intersections so as to cover the third connecting line 16. The first connecting line 11 passes over the interlayer insulating films 17*a* to 17*b*, so that electrical insulation between the first connecting line 11 and the third connecting line 16 is provided.

An appropriate insulating material, such as $SiO_2$, can be used for the interlayer insulating films 17*a* to 17*c*, and the forming method is not limited.

In this preferred embodiment, the first connecting line 11 includes a first straight portion 11*a* extending from the center IDT 7*b* of the first filter element 7 onto the electrode land 14, a second straight portion 11*b* extending straight from the center IDT 8*b* of the second filter element 8, and a third straight portion 11*c* that bends at a right angle toward the first filter element 7 at the end opposite to the IDT 8*b* of the straight portion 11*b* and that extends straight. The end of the third straight portion 11*c* connects to the first straight portion 11*a*. Thus, the first connecting line 11 includes the above-described plurality of straight portions 11*a* to 11*c*, so that the IDTs 7*b* and 8*b* connect to the electrode pad 14 with relatively short distances therebetween.

On the other hand, the third connecting line 16 includes straight portions 16*a*, 16*b*, 16*c*, and 16*d* externally extending from the ends of the IDTs 7*a*, 7*c*, 8*a*, and 8*c* in the direction that electrode fingers of the IDTs extend, and also include a straight portion 16*e* connecting external ends of those straight portions 16 to 16*d*. The straight portion 16*e* is connected to the unbalanced terminal 3 via the SAW resonator 6. Thus, the third connecting line 16 also includes the above-described straight portions 16*a* to 16*e*, which enable the IDTs 7*a*, 7*c*, 8*a*, and 8*c* to connect to the SAW resonator 6 and the unbalanced terminal 3 with relatively short distances therebetween.

The ends opposite to the above-described common midpoint grounded portion of the IDTs 7*b* and 8*b* are connected to the SAW resonators 9 and 10 via connecting lines 19 and 20, respectively, and thus are connected to the first and second balanced terminals 4 and 5, respectively. On the other hand, the ends opposite to the ends connected to the unbalanced terminal 3 of the IDTs 7*a*, 7*c*, 8*a*, and 8*c* are connected to the second connecting line 12. The second connecting line 12 allows the grounded ends of the IDTs 7*a*, 7*c*, 8*a*, and 8*c* to be mutually connected and connects to an electrode pad 22. A bump 23 is attached to the electrode pad 22. The bump 23 is connected to an electrode land connecting to the ground potential of the package. Thus, the second connecting line 12 defines an unbalanced-side grounded portion. The unbalanced-side grounded portion is separated from the common midpoint grounded portion defined by the first connecting line 11 on the SAW substrate 2.

Interlayer insulating films 18*a* and 18*b*, formed in the same manner as the interlayer insulating films 17*a* to 17*c*, are disposed at positions where the second connecting line 12 crosses the connecting lines 19 and 20.

The first and second balanced terminals 4 and 5 are defined as electrode pads having a predetermined area. Metallic bumps 24 and 25 are attached to the respective electrode pads.

Figure 3:
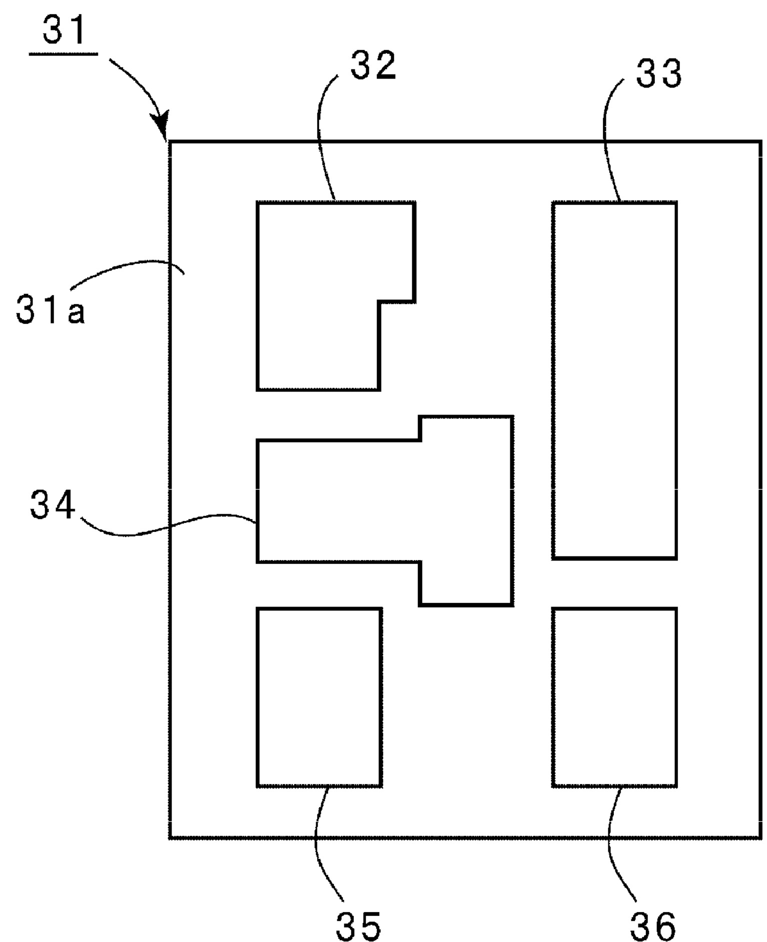
FIG. 3 is a plan view showing a package used in the SAW filter according to the first preferred embodiment of the present invention.
Figure 4:
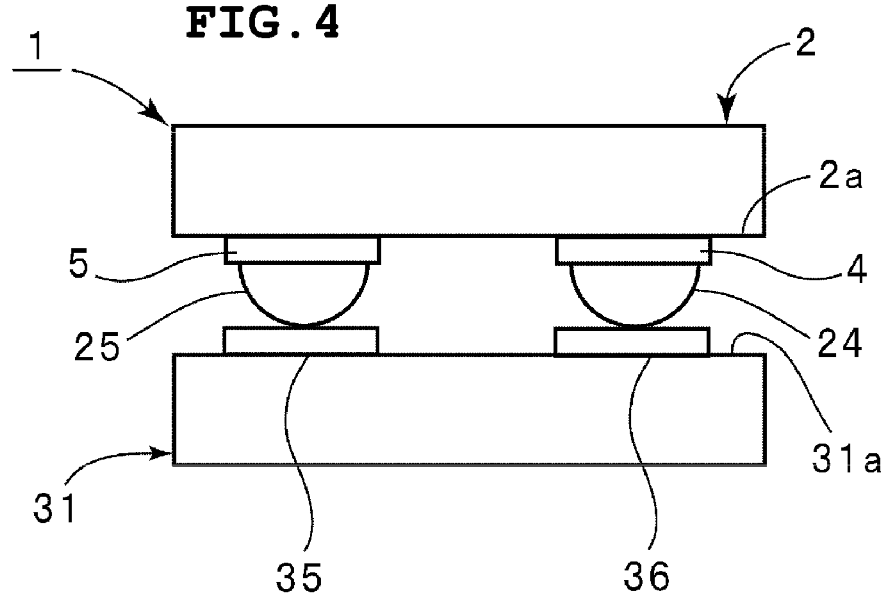
FIG. 4 is a schematic front view showing the SAW filter according to the first preferred embodiment of the present invention.

When the SAW filter 1 is to be produced, the SAW filter 1 is attached to a package 31 shown in a plan view in FIG. 3 such that the principal surface 2*a* of the SAW substrate 2 is a lower surface. That is, as shown in the simplified front view in FIG. 4, the SAW filter 1 is attached to the package 31 by bump bonding in a face-down method, so that the SAW filter 1 is made into a product.

As shown in FIG. 3, the package 31 is formed by using a plate substrate, and a plurality of electrode lands 32 to 36 are placed on an upper surface 31*a* thereof. The electrode lands 32 to 36 can be formed by forming a film made of an appropriate conductive material on an entire surface and then performing patterning, or by applying a conductive material in a printing method, or other suitable method.

The metallic bump 13 (see FIG. 2) attached to the input terminal 3 is attached to the electrode land 32. On the other hand, the bump 15 provided in the common midpoint grounded portion is attached to the electrode land 33 connecting to the ground potential.

On the other hand, the metallic bumps 23, 24, and 25 shown in FIG. 2 are attached to the electrode lands 34, 36, and 35, respectively.

As described above, in the SAW filter 1 according to this preferred embodiment, the IDTs 7*b* and 8*b* are mutually connected by the first connecting line 11 so that the common midpoint grounded portion is provided, and the common midpoint grounded portion is separated from the unbalanced-side grounded portion provided by the second connecting line 12 on the SAW substrate 2. With this configuration, out-of-band attenuation is effectively improved as compared to that of a conventional equivalent SAW filter. This is clarified below by a comparison between the above-described preferred embodiment and a comparative example shown in FIGS. 5 and 6.

Figure 5:
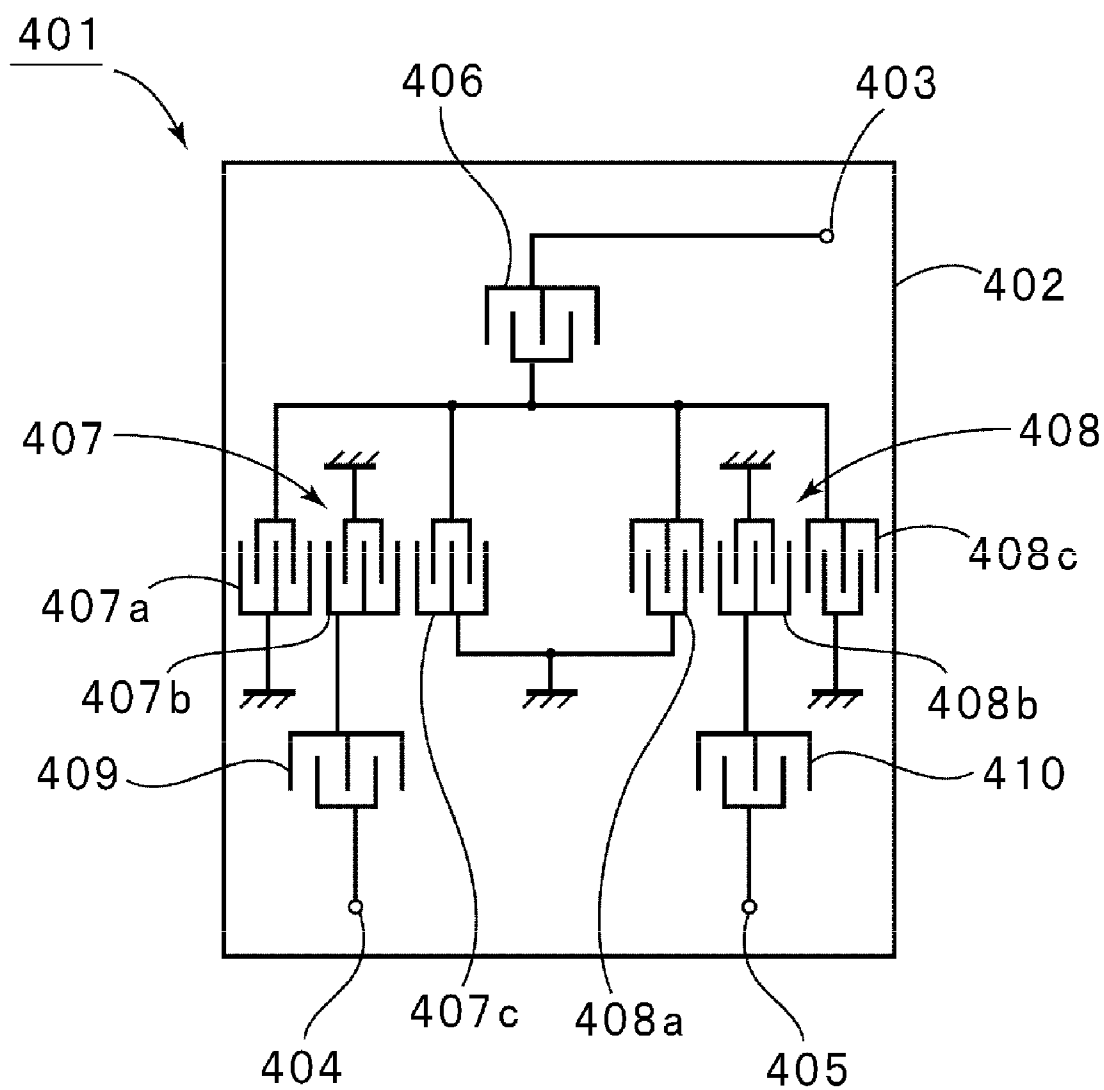
FIG. 5 is a schematic plan view showing a circuit configuration of a SAW filter according to a comparative example.
Figure 6:
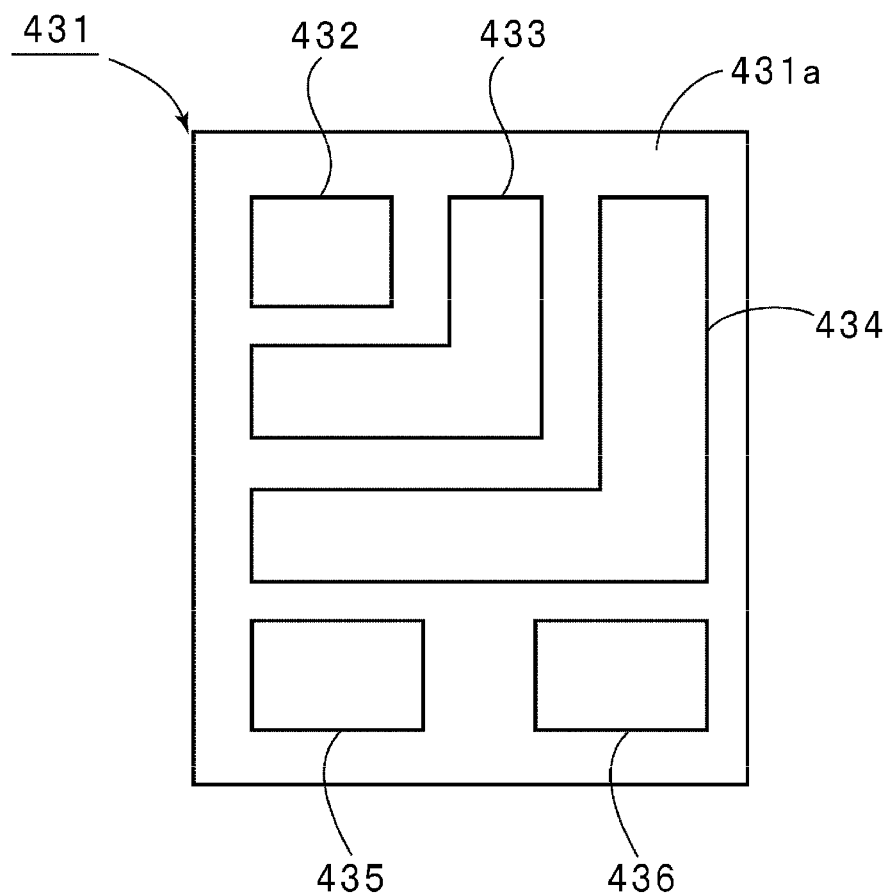
FIG. 6 is a plan view showing a package used in the SAW filter according to the comparative example.

FIG. 5 is a schematic plan view showing a circuit configuration of a SAW filter corresponding to a known SAW filter having a balance-unbalance converting function as described in Patent Document 1. In this SAW filter, neither a midpoint grounded portion nor an unbalanced-side grounded portion has a common connection. FIG. 6 is a plan view showing a package on which this SAW filter is mounted by the face-down method. In FIG. 5, elements corresponding to those shown in FIG. 1 are denoted by 400+the reference numerals shown in FIG. 1.

In a SAW 401, grounded ends of an IDT 407*b* of a first filter element 407 and an IDT 408*b* of a second filter element 408 are independently grounded. That is, a common midpoint grounded portion is not provided in a SAW substrate 402.

Also, grounded ends of IDTs 407*a* and 407*c* are separately grounded. Likewise, grounded ends of IDTs 408*a* and 408*c* are separately grounded. Note that grounded ends of the IDTs 407*c* and 408*a* are mutually connected.

Other than that, the SAW filter 401 has the same configuration as that of the SAW 1.

In a package 431 shown in FIG. 6, an unbalanced terminal 403 shown in FIG. 5 is attached to an electrode land 432 provided on an upper surface 431*a*. Bumps attached to the grounded ends of the IDTs 407*b* and 408*b* are attached to an L-shaped electrode land 433. In other words, a common midpoint grounded portion is provided on the electrode land 433. That is, the common midpoint grounded portion is provided by using the electrode land 433.

Likewise, a bump attached to the IDT 407*a*, a bump connected in common to the grounded ends of the IDTs 407*c* and 408*a*, and a metallic bump connected to the grounded end of the IDT 408*c* are attached to an electrode land 434. That is, the plurality of bumps connected to the grounded ends of the IDTs 407*a*, 407*c*, 408*a*, and 408*c* on the unbalanced side are mutually connected on the electrode land 434 on the package 431.

On the other hand, balanced terminals 405 and 404 are attached to electrode lands 435 and 436, respectively.

Figure 7:
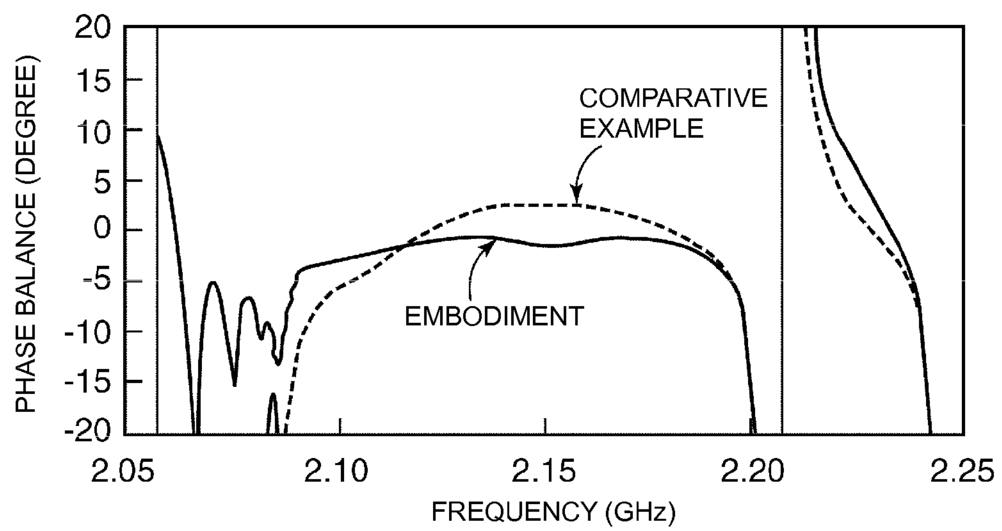
FIG. 7 shows characteristics of phase balance to frequency of the SAW filters according to the first preferred embodiment of the present invention and the comparative example.
Figure 8:
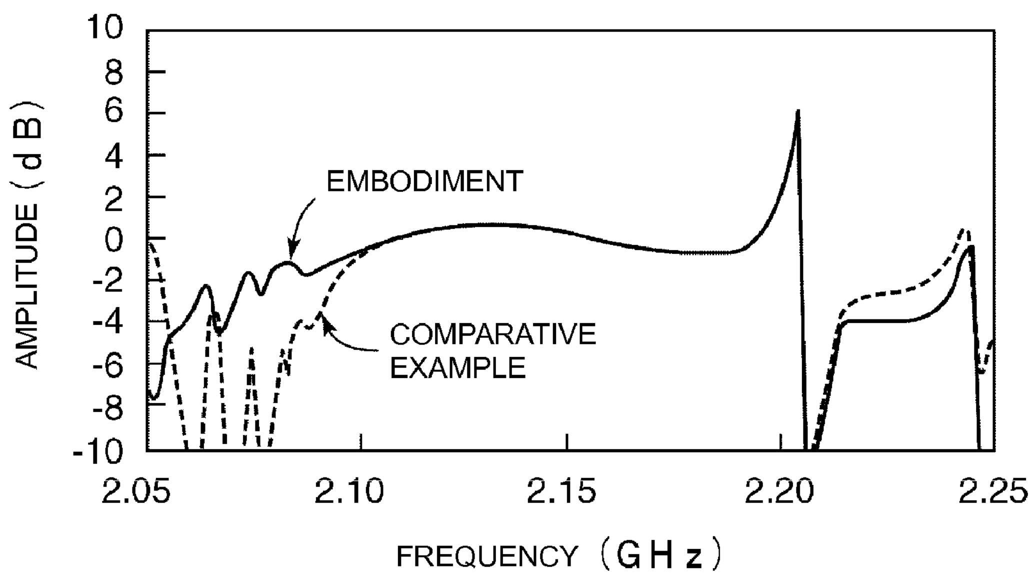
FIG. 8 shows characteristics of amplitude balance to frequency of the SAW filters according to the first preferred embodiment of the present invention and the comparative example.
Figure 9:
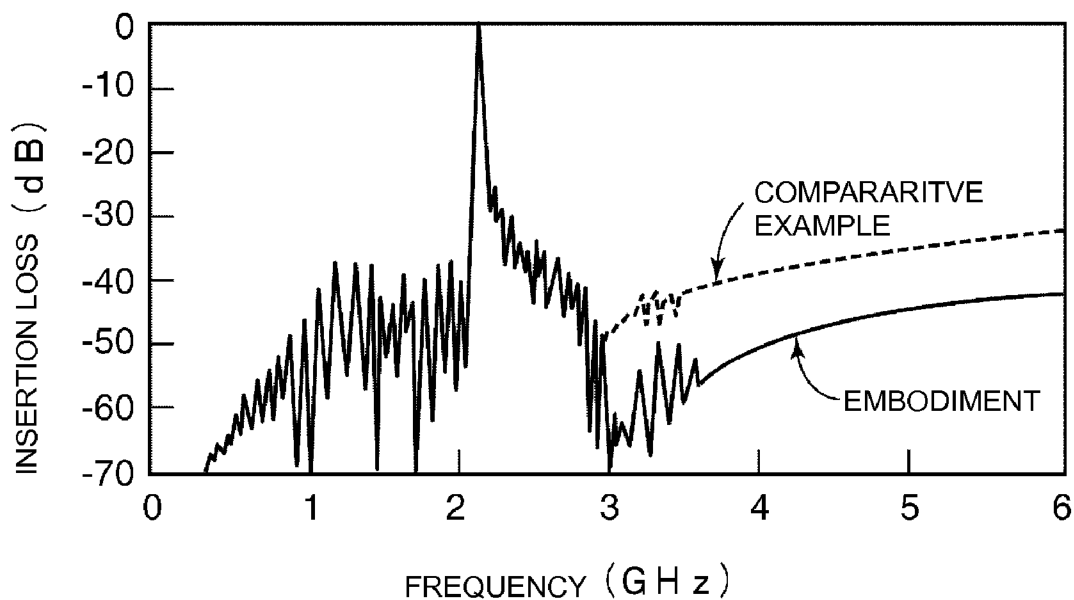
FIG. 9 shows characteristics of insertion loss to frequency of the SAW filters according to the first preferred embodiment of the present invention and the comparative example.
Figure 10:
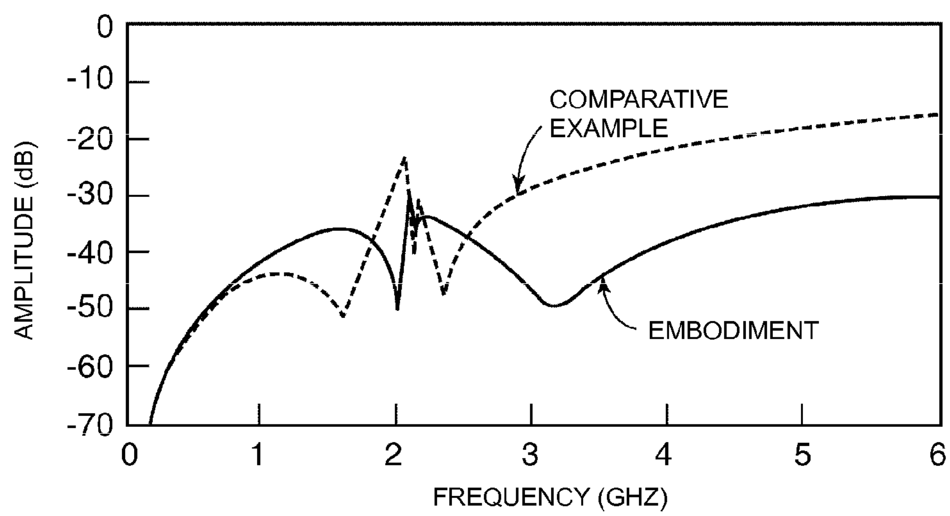
FIG. 10 shows characteristics of common-mode attenuation to frequency of the SAW filters according to the first preferred embodiment of the present invention and the comparative example.

Frequency characteristics were measured in a state in which the SAW filter 1 according to the above-described preferred embodiment and the SAW filter 401 according to the comparative example are mounted on the packages 31 and 431, respectively. FIGS. 7 to 10 show measurement results. FIG. 7 shows characteristics of phase balance to frequency; FIG. 8 shows characteristics of amplitude balance to frequency; FIG. 9 shows characteristics of insertion loss to frequency; and FIG. 10 shows characteristics of common-mode attenuation to frequency. In each figure, the solid line indicates a result in the preferred embodiment and the broken line indicates a result in the comparative example.

The above-mentioned amplitude balance and phase balance indicate the level of balance of an amplitude characteristic between the pair of balanced terminals 4 and 5 and the level in which the phase is inverted by 180 degrees. The amplitude balance and phase balance are defined as follows.

That is, the amplitude balance and the phase balance are defined as follows: amplitude balance=[A], A=|20 log (S21)|−|20 log(S31)|; and phase balance=B-180, B=|∠S21−∠S3|, assuming that the SAW filter having a balance-unbalance converting function is a 3-port device, in which an unbalanced input terminal is a first port and balanced output terminals are second and third ports. S21 indicates a transfer coefficient from the first port to the second port, S31 indicates a transfer coefficient from the first port to the third port, and || in the above expressions indicates an absolute value.

Between the pair of balanced signal terminals, an ideal amplitude balance is 0 dB and an ideal phase balance is 0 degree in a pass band.

As shown in FIGS. 7 to 10, a pass band is about 2.10 to about 2.20 (GHz) in the SAW filter 1 according to the present preferred embodiment. Within this pass band, the SAW filter 1 is superior to the SAW filter according to the comparative example in the phase balance and the amplitude balance.

Also, as shown in FIG. 9, out-of-band attenuation is significantly improved in the present preferred embodiment, especially at a higher-frequency side, as compared to the SAW filter 401 according to the comparative example.

Furthermore, as shown in FIG. 10, common mode attenuation is significantly improved in the preferred embodiment, especially out of band at a higher-frequency side, as compared to the SAW filter according to the comparative example.

As described above, in the SAW filter 1 according to the present preferred embodiment, out-of-band attenuation is improved and balance such as phase balance is improved as compared to the SAW filter 401 according to the comparative example. The possible reasons are as follows.

That is, since the common midpoint grounded portion on the acoustic wave substrate achieves a common connection, an electrical midpoint exists on the acoustic wave substrate. Thus, the distance between the common midpoint grounded portion and the electrical midpoint is small, the impedance between the both sides is low, the balance is improved, and out-of-band attenuation of the filter is expanded. That is, the common midpoint grounded portion and the unbalanced-side grounded portion separated from each other are connected by impedance or inductance, so that the attenuation in a high-frequency side of the pass band is improved. The inductance value in this case is not limited, but may be about 0.1 nH to about 10 nH. In addition, on the acoustic wave substrate, the grounded ends of the IDTs of the first filter element connected to the unbalanced terminal and the grounded ends of the IDTs of the second filter element connected to the unbalanced terminal are mutually connected by the second connecting line, so that the unbalanced-side grounded portion is defined. That is, the ground on the unbalanced side is shared on the acoustic wave substrate. Accordingly, flow of ground current is appropriately controlled and the out-of-band attenuation is expanded accordingly.

In addition, in the SAW filter 1 according to the above-described preferred embodiment, each of the first and third connecting lines is formed by combining straight lines, and connects the electrode land 14 or the unbalanced terminal 3 to the IDTs with relatively short distances therebetween. Furthermore, at intersections between the first connecting line 11 and the third connecting line 16, electrical insulation is achieved by the interlayer insulating films 17*a* to 17*c*. Also, the second connecting line 12 includes a plurality of straight portions so as to connect the grounded ends of the plurality of IDTs 7*a*, 7*c*, 8*a*, and 8*c* with a short distance therebetween. In the second connecting line 12, interlayer insulating films 17*a* and 18*a* are provided at the intersections with the connecting lines 19 and 20 so as to achieve electrical insulation.

As described above, the connecting lines 11, 12, and 16 including a plurality of straight portions and the interlayer insulating films 17*a* to 17*c* and 18*a* to 18*b* are provided, and the plurality of connecting lines cross each other such that they are electrically insulated from each other. With this configuration, a density of electrodes and connecting lines on the principal surface 2*a* of the SAW substrate 2 is effectively increased in the SAW filter 1. That is, the SAW filter 1 can be further miniaturized as compared to the SAW filter 401 according to the comparative example.

In addition to the above-described miniaturization, the common midpoint grounded portion and the unbalanced-side grounded portion are provided on the SAW substrate 2, not on the package 31, and are separated from each other. Thus, the out-of-band attenuation is expanded and the balance is improved as shown in FIGS. 7 to 10.

According to this preferred embodiment, a miniaturized balanced SAW filter device having an excellent frequency characteristic is easily provided.

Figure 11:
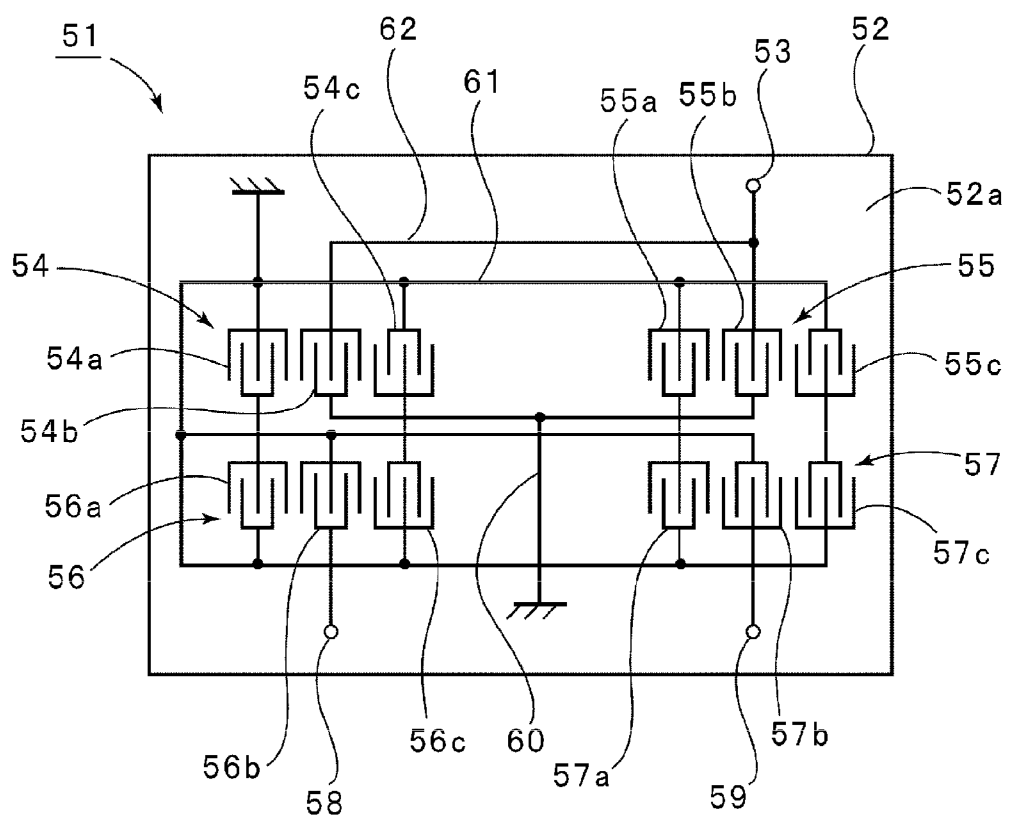
FIG. 11 is a schematic plan view showing a circuit configuration of a SAW filter according to a second preferred embodiment of the present invention.
Figure 12:
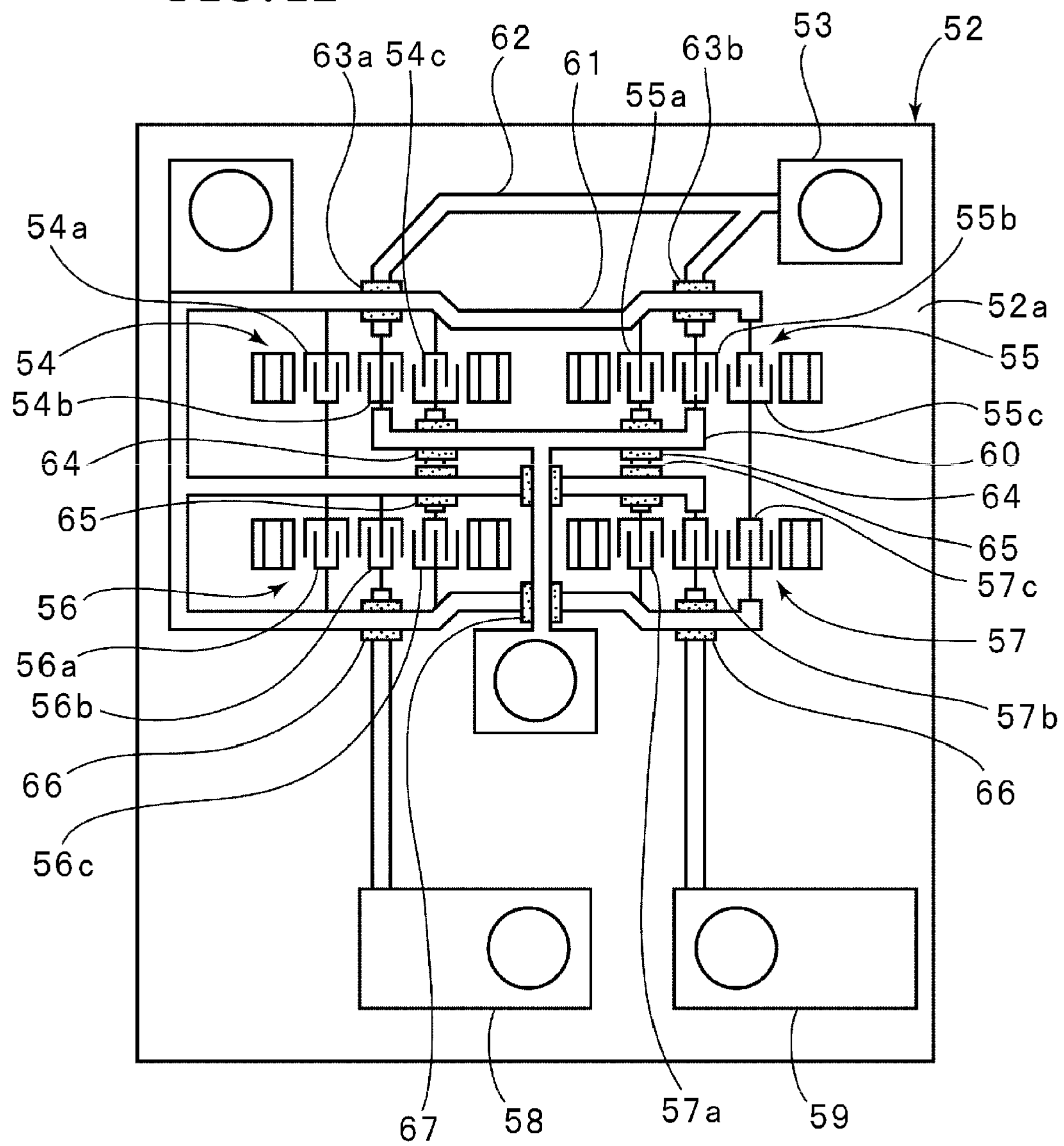
FIG. 12 is a schematic plan view showing an electrode configuration of the SAW filter according to the second preferred embodiment of the present invention.

FIG. 11 is a plan view showing a circuit configuration of a SAW filter according to a second preferred embodiment of the present invention, and FIG. 12 is a schematic plan view showing an electrode configuration thereof.

In a SAW filter 51 according to the second preferred embodiment, various electrodes and connecting lines are disposed on a principal surface 52*a* of a surface wave substrate 52, so that the SAW filter is provided. More specifically, first and second filter elements 54 and 55 are connected to an unbalanced terminal 53. Also, filter elements 56 and 57 are disposed in the subsequent stages of the filter elements 54 and 55.

The filter elements 54 to 57 are 3-IDT longitudinally-coupled SAW filters including three IDTs 54*a* to 54*c*, 55*a* to 55*c*, 56*a* to 56*c*, or 57*a* to 57*c*. Although not shown in FIG. 11, in each of the SAW filter elements 54 to 57, a pair of reflectors is provided on both sides of the three IDTs in the propagation direction of surface waves. The reflectors are schematically shown in FIG. 12. The third filter element 56 and the fourth filter element 57 are connected to first and second balanced terminals 58 and 59.

More specifically, one end of the center IDT 54*b* of the first filter element 54 and one end of the center IDT 55*b* of the second filter element 55 are mutually connected as an unbalanced terminal and are connected to the unbalanced terminal 53.

Grounded ends of the IDTs 54*b* and 55*b* are mutually connected by a second connecting line 60, so that an unbalanced-side grounded portion is provided.

On the other hand, ends of the IDTs 54*a*, 54*c*, 55*a*, and 55*c* are connected to the IDTs 56*a*, 56*c*, 57*a*, and 57*c*, respectively. The other ends of the IDTs 54*a*, 54*c*, 55*a*, and 55*c* are grounded ends and are mutually connected by a first connecting line 61, so that a common midpoint grounded portion is provided. The first connecting line 61 is also connected to grounded ends of the IDTs 56*a*, 56*c*, 57*a*, and 57*c*.

On the other hand, the grounded ends of the IDTs 56*b* and 57*b* connect to the first connecting line 61.

In this preferred embodiment, the common midpoint grounded portion and the unbalanced-side grounded portion are disposed on the principal surface 52*a* of the SAW substrate 52 and are electrically separated from each other.

In this preferred embodiment, as in the SAW filter 1 according to the first preferred embodiment, miniaturization and expansion of out-of-band attenuation are achieved.

In FIG. 12, elements common to those in FIG. 11 are denoted by the same reference numerals. As is clear from FIG. 12, in this preferred embodiment, the first connecting line 61 and a third connecting line 62 cross each other at a plurality of positions, and interlayer insulating films 63*a* and 63*b* are provided at the intersections. That is, the interlayer insulating films 63*a* and 63*b* provide electrical insulation between the first and third connecting lines 61 and 62.

Likewise, as shown in FIG. 12, interlayer insulating films 64 to 67 are provided at intersections between other connecting lines. As a package for mounting the SAW filter 51 according to this preferred embodiment, a package similar to the package 31 shown in FIG. 3 may be used.

In the present invention, as is clear from the SAW filter 51 according to the second preferred embodiment, a midpoint-grounded balanced SAW filter having a two-stage and four-element configuration may be used, unlike in the first preferred embodiment.

Figure 13:
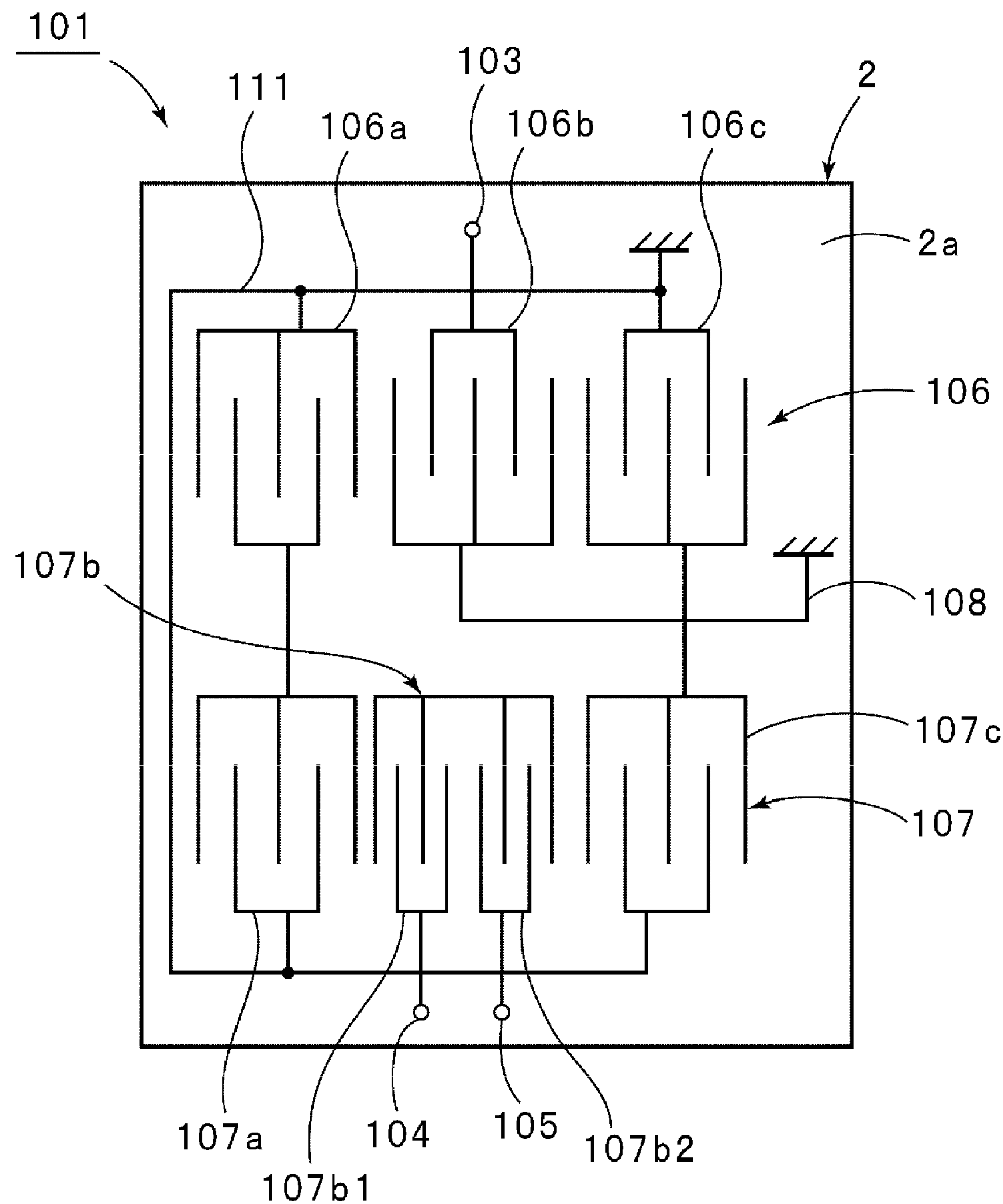
FIG. 13 is a schematic plan view showing a circuit configuration of a SAW filter according to a third preferred embodiment of the present invention.
Figure 14:
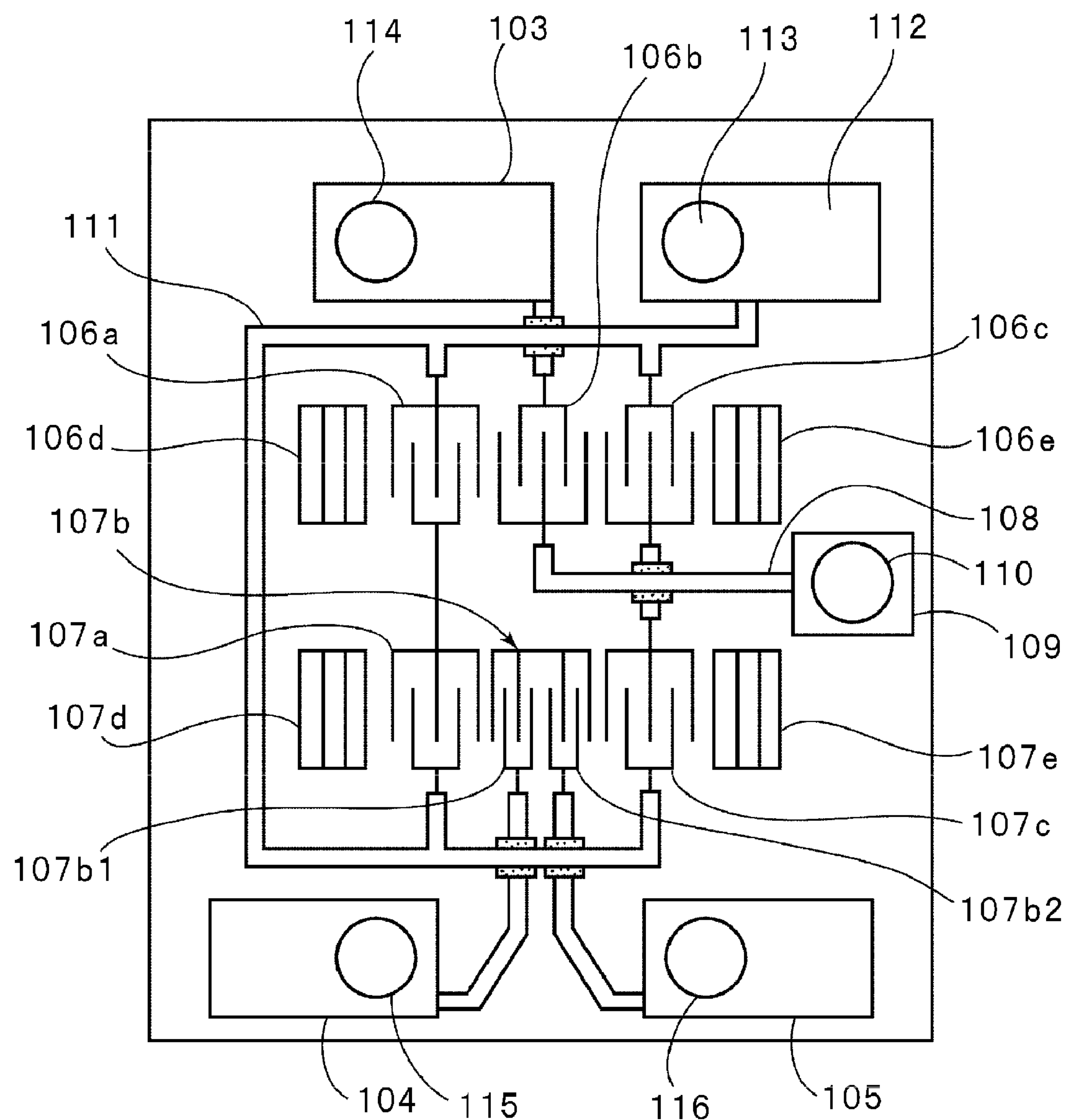
FIG. 14 is a schematic plan view showing an electrode configuration of the SAW filter according to the third preferred embodiment of the present invention.

FIG. 13 is a schematic plan view showing a circuit configuration of a SAW filter according to a third preferred embodiment of the present invention, and FIG. 14 is a schematic plan view showing an electrode configuration thereof.

In a third SAW filter 101, various electrodes and connecting lines are disposed on a principal surface 2*a* of a surface wave substrate 2. That is, a first filter element 106 and a second filter element 107 are connected between an unbalanced terminal 103 and first and second balanced terminals 104 and 105. Herein, the first filter element 106 is connected in a former stage, whereas the second filter element 107 is connected in a latter stage. Thus, a midpoint-grounded balanced SAW filter having a two-stage configuration, each stage including one element, is provided.

The first filter element 106 is a 3-IDT longitudinally-coupled resonator SAW filter including three IDTs 106*a* to 106*c*. As shown in FIG. 14, reflectors 106*d* and 106*e* are disposed on both sides of an area provided with the IDTs 106*a* to 106*c* in the propagation direction of surface waves. The IDTs 106*a* and 106*c* have inverted phases.

The second filter element 107 includes three IDTs 107*a* to 107*c*. Although not shown in FIG. 13, reflectors 107*d* and 107*e* are disposed on both sides of an area provided with the IDTs 107*a* to 107*c* in the propagation direction of surface waves, as shown in FIG. 14.

The unbalanced terminal 103 is connected to one end of the IDT 106*b* of the first filter element 106. The other end of the IDT 106*b* is a grounded end and is connected to a second connecting line 108. The second connecting line 108 is connected to an electrode pad 109 shown in FIG. 14 and defines an unbalanced-side grounded portion. A bump 110 is attached to the electrode pad 109.

On the other hand, ends of the IDTs 106*a* and 106*c* are connected to the IDTs 107*a* and 107*c* of the filter element 107 in the subsequent stage. The other ends of the IDTs 106*a* and 106*c* are midpoint grounded ends and are mutually connected by a first connecting line 111. Thus, the first connecting line 111 defines a common midpoint grounded portion. The first connecting line 111 also provides a common connection of the grounded ends of the IDTs 107*a* and 107*c*. The first connecting line 111 is connected to an electrode land 112. A metallic bump 113 is attached onto the electrode land 112.

The IDT 107*b* of the second filter element 107 includes IDT portions 107*b*1 and 107*b*2 arranged in parallel. That is, the IDT portions 107*b*1 and 107*b*2 and a comb electrode that is engaged with the IDT portions 171*b*1 and 171*b*2 define the IDT 107*b*. The balanced terminals 104 and 105 are electrically connected to the IDT portions 107*b*1 and 107*b*2, respectively.

As shown in FIG. 14, a metallic bump 114 is attached to an electrode land corresponding to the unbalanced terminal 103. Likewise, bumps 115 and 116 are attached to electrode pads corresponding to the first and second balanced terminals 104 and 105, respectively.

In the midpoint-grounded balanced SAW filter having a 1 element×2 stage configuration as in this preferred embodiment, a common midpoint grounded portion is defined by the first connecting line 111 and the common midpoint grounded portion is separated from the unbalanced-side grounded portion on the principal surface 2*a* of the SAW substrate 2 according to the present invention. With this configuration, out-of-band attenuation is expanded and balance is improved.

That is, the SAW filter 101 can be mounted on a package in the face-down method using the above-described bumps 110, 113, and 114 to 116. In this preferred embodiment, the midpoint grounded portion functions as a common midpoint grounded portion by using the first connecting line 111 on the SAW substrate 2 of the SAW filter 101, and is separated from the unbalanced-side grounded portion. Thus, midpoint grounded portions need not be mutually connected on the package side. Accordingly, out-of-band attenuation is expanded and balance is improved as in the first preferred embodiment.

Furthermore, the first connecting line 111 and the second connecting line 108 are disposed on the principal surface 2*a* of the surface wave substrate 2, and these lines are arranged at high density so that they cross each other. Accordingly, the density of electrodes and the arrangement density of connecting lines are increased in the SAW filter 101, which enables miniaturization.

Figure 15:
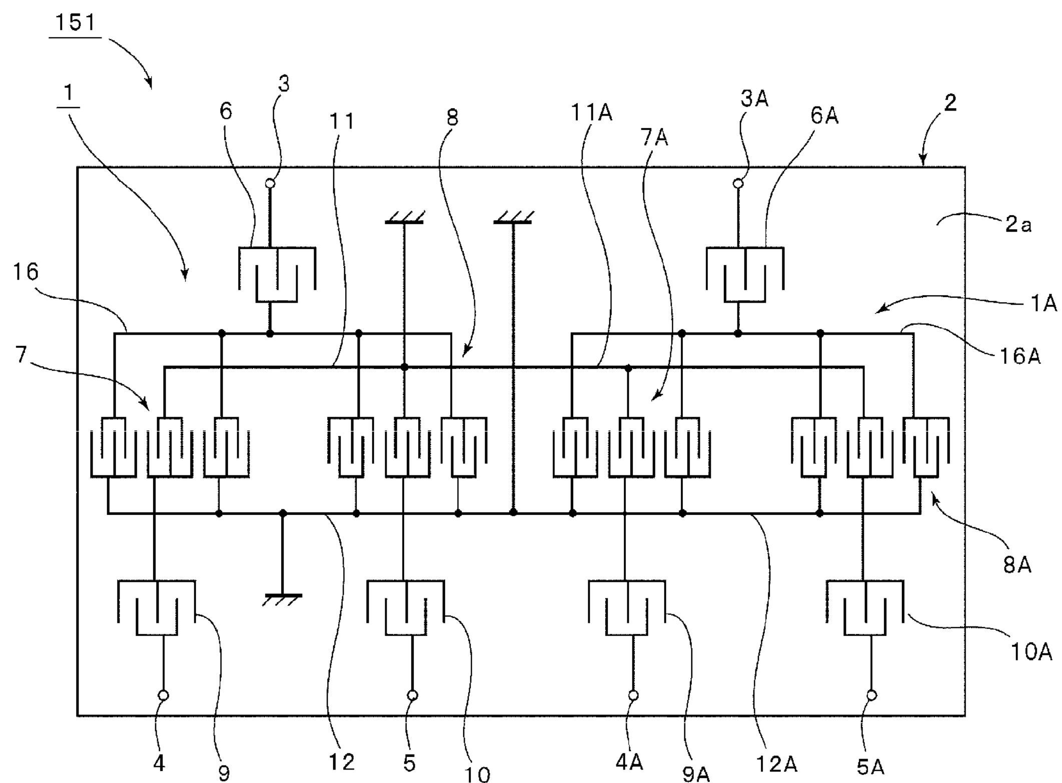
FIG. 15 is a schematic plan view showing a circuit configuration of a SAW filter device according to a fourth preferred embodiment of the present invention.
Figure 16:
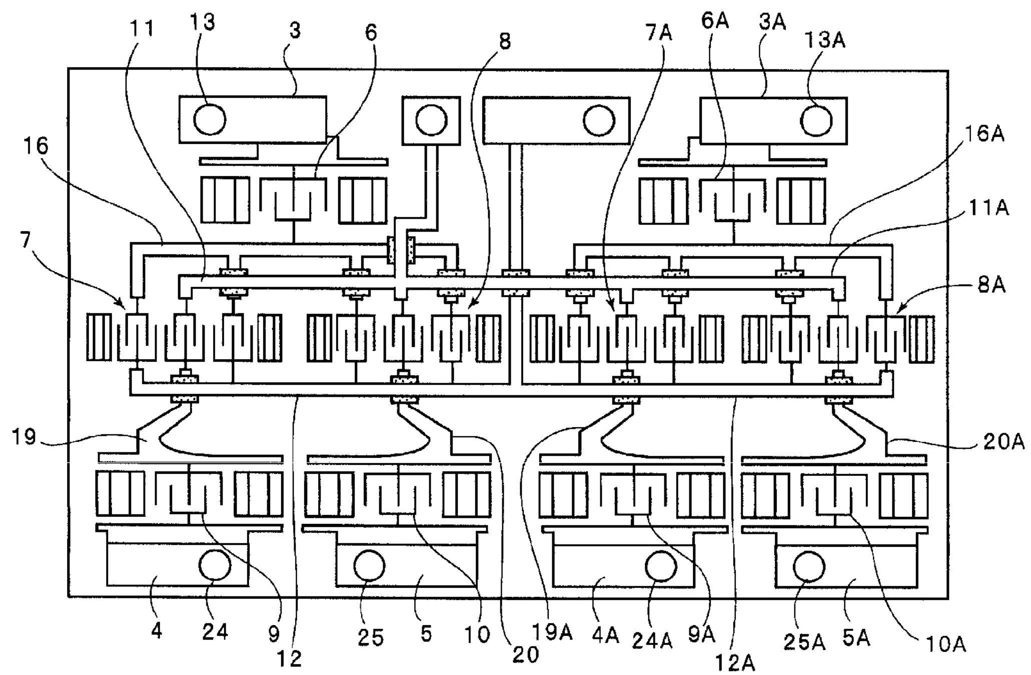
FIG. 16 is a schematic plan view showing an electrode configuration of the SAW filter device according to the fourth preferred embodiment of the present invention.

FIG. 15 is a schematic plan view showing a circuit configuration according to a fourth preferred embodiment, and FIG. 16 is a schematic plan view showing an electrode pattern thereof.

In a SAW filter device 151 according to the fourth preferred embodiment, two SAW filters, each being the SAW filter 1 according to the first preferred embodiment, are disposed on a surface wave substrate 2.

An electrode configuration that is the same as that of the SAW filter 1 according to the first preferred embodiment is disposed on a principal surface 2*a* of the SAW substrate 2. That is, the electrode configuration that is the same as that of the first preferred embodiment is disposed between an unbalanced terminal 3 and first and second balanced terminals 4 and 5. In addition to the unbalanced terminal 3, an unbalanced terminal 3A is provided. A pair of first and second balanced signal terminals 4A and 5A is provided for the unbalanced terminal 3A. The electrode configuration that is the same as that of the SAW filter 1 according to the first preferred embodiment is provided between the unbalanced terminal 3A and the balanced terminals 4A and 5A.

That is, the SAW filter device 151 corresponds to a configuration including two SAW filters 1 and 1A according to the first preferred embodiment.

In FIG. 16, the same elements of the electrodes and connecting lines in the SAW filter 1A as those in the SAW filter 1 are denoted by corresponding reference numerals attached with A, and the detailed description thereof is omitted.

Note that the center frequency of the SAW filter 1A is different from that of the SAW filter 1.

According to this preferred embodiment, the SAW filter device 151, in which the two SAW filters 1 and 1A having different frequencies and having a 1 element×1 stage configuration are integrated, is obtained.

As shown in FIGS. 15 and 16, the common midpoint grounded portions of the SAW filters 1 and 1A are mutually connected by coupling the first connecting lines 11 and 11A. Likewise, the unbalanced-side grounded portions are coupled.

In the present invention, a plurality of SAW filter elements according to the present invention can be disposed on a single SAW substrate, as in this preferred embodiment. Since each SAW filter element is configured in accordance with the present invention, out-of-band attenuation is expanded and balance is improved, and further miniaturization achieved. Furthermore, by providing a plurality of SAW filter elements on a single SAW substrate, a more miniaturized high-density filter device is obtained.

As described above, by using the plurality of SAW filters 1 and 1A having different frequencies, the SAW filter device 151 can be used as a duplexer or a multi-band filter.

Figure 17:
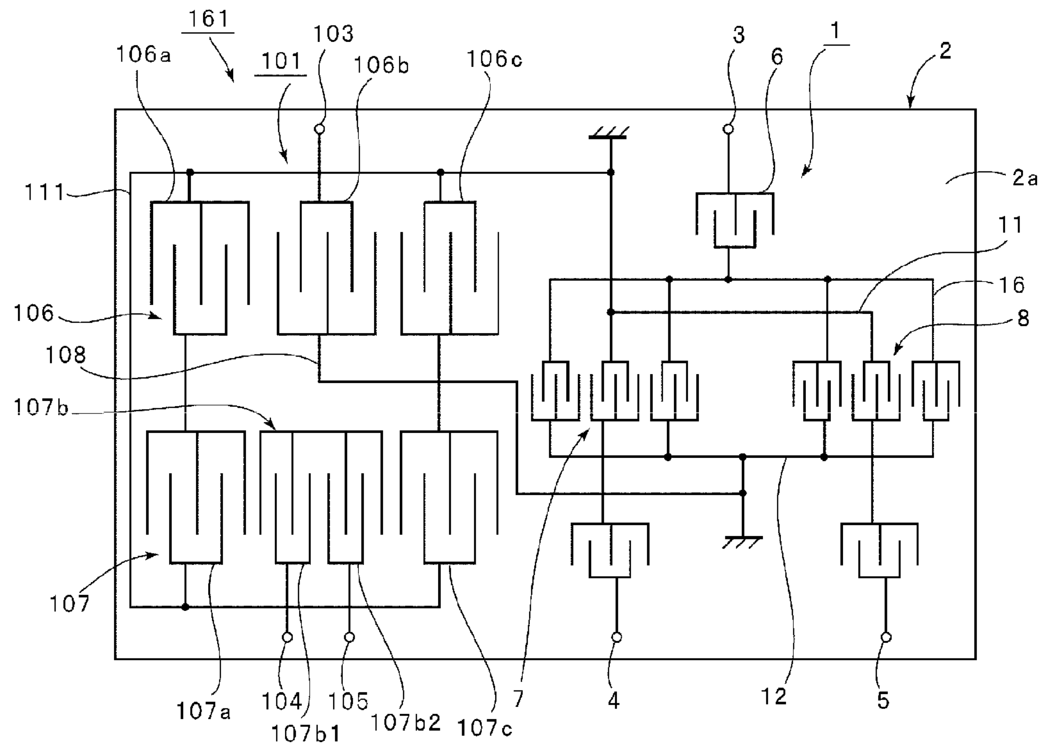
FIG. 17 is a schematic plan view showing a circuit configuration of a SAW filter device according to a fifth preferred embodiment of the present invention.
Figure 18:
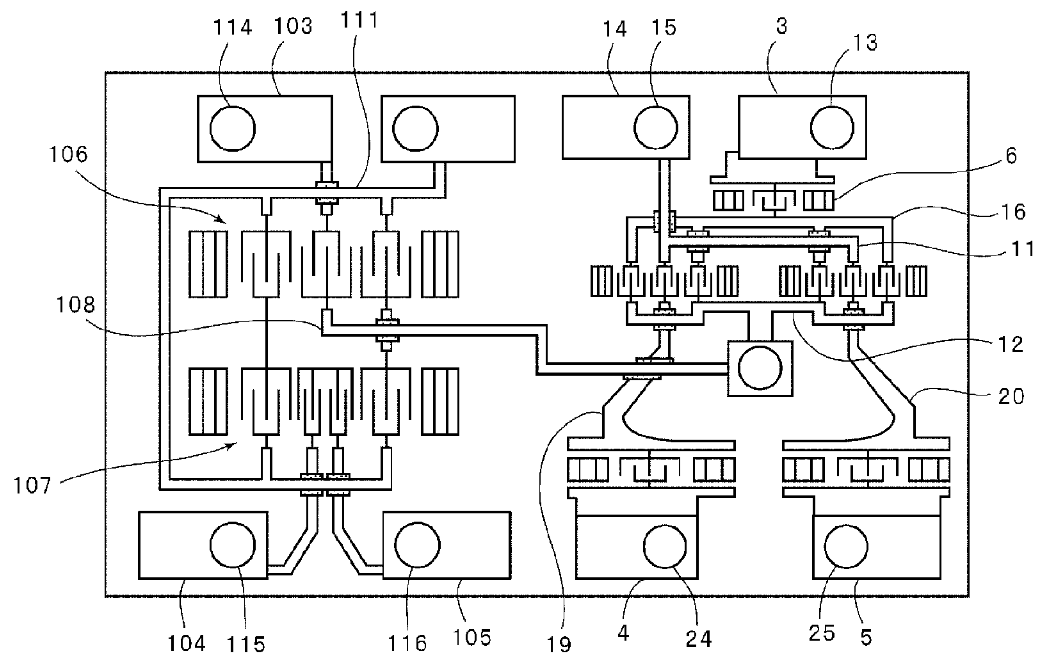
FIG. 18 is a schematic plan view showing an electrode configuration of the SAW filter device according to the fifth preferred embodiment of the present invention.

FIG. 17 is a schematic plan view showing a circuit configuration of a SAW filter according to a fifth preferred embodiment of the present invention, and FIG. 18 is a schematic plan view showing an electrode configuration thereof.

In a SAW filter device 161, two SAW filter elements configured according to the present invention are disposed on one SAW substrate 2, as in the SAW filter device 151. In the fifth preferred embodiment, one of the SAW filter elements is the SAW filter 101 having a 1 element×2 stage configuration according to the above-described third preferred embodiment, and other SAW filter element is the SAW filter 1 according to the first preferred embodiment.

The center frequency of the SAW filter 101 is different from the center frequency of the SAW filter 1.

As in the fourth preferred embodiment, the common midpoint grounded portion of the first SAW filter 101 and the common midpoint grounded portion of the second SAW filter 1 are mutually connected by connecting the first connecting line. Also, the unbalanced-side grounded portions of the SAW filters 1 and 101 are mutually connected by common connection of connecting lines.

In FIG. 18, the respective elements are denoted by the reference numerals used in the description about the electrode configuration of the first and third preferred embodiments. The description about the first and third preferred embodiments is used for detailed description about the respective elements.

As in the fifth preferred embodiment, two SAW filter elements may be configured as a single chip by combining the SAW filter elements according to the first and third preferred embodiments. In this case, out-of-band attenuation is expanded and balance is improved in each of the SAW filters 1 and 101. In addition, further miniaturization is achieved because the two SAW filters 101 and 1 are integrated.

Figure 19:
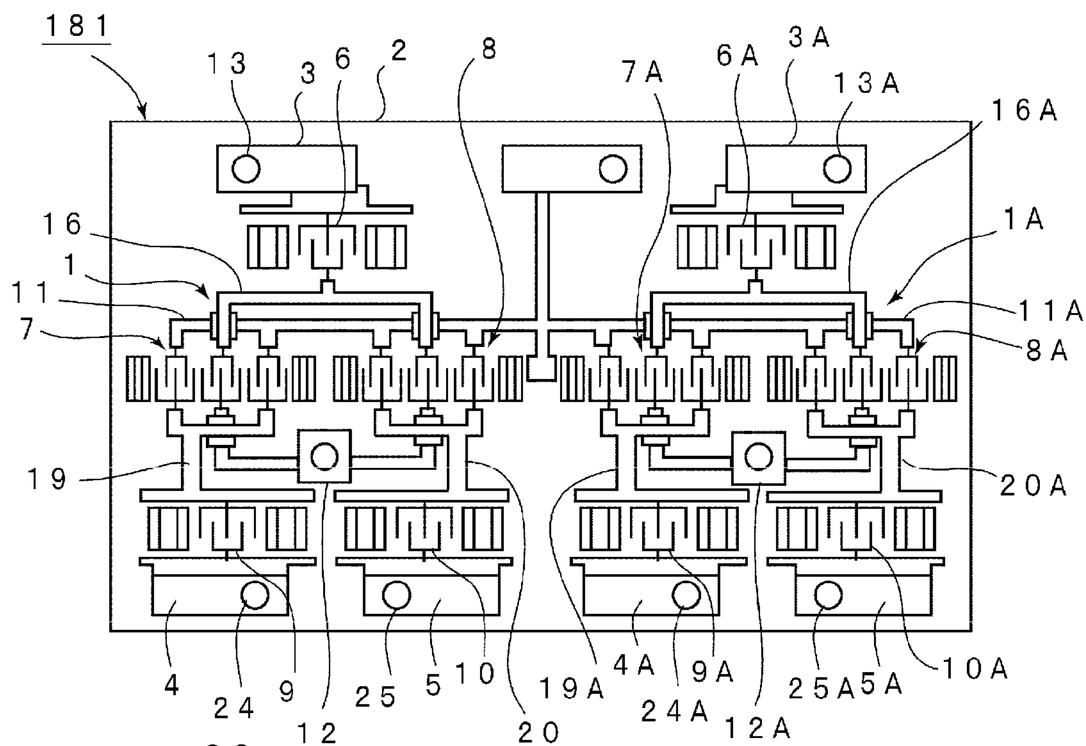
FIG. 19 is a schematic plan view showing an electrode configuration of a SAW filter chip used in a sixth preferred embodiment of the present invention.

FIG. 19 is a schematic plan view showing an electrode configuration of a SAW filter chip in an acoustic wave device according to a sixth preferred embodiment of the present invention. In the acoustic wave device according to the sixth preferred embodiment, a SAW filter chip 181 shown in the plan view in FIG. 19 is attached to a package substrate as a package (described below) using bumps.

In the SAW filter chip 181 used in this preferred embodiment, two SAW filters, each being the SAW filter 1 according to the first preferred embodiment, are disposed on a surface wave substrate 2, as in the SAW filter device 151 according to the fourth preferred embodiment.

That is, the SAW filter chip 181 has a configuration including two SAW filters 1 and 1A according to the first preferred embodiment provided on a surface wave substrate.

In FIG. 19, the same elements of the electrodes and connecting lines in the SAW filter 1A as those in the SAW filter 1 are denoted by corresponding reference numerals attached with A, and the detailed description thereof is omitted.

As in the SAW filter device 151 according to the fourth preferred embodiment, the center frequency of the SAW filter 1A is different from the center frequency of the SAW filter 1.

Therefore, according to this preferred embodiment, the SAW filter chip 181, in which the first and second SAW filters 1 and 1A having a 1 element×1 stage configuration and having different frequencies are integrated, is used. With this SAW filter chip 181, a duplexer or a multi-band filter can be provided.

For example, a DCS receiving filter can be provided by the first SAW filter and a PCS receiving filter can be provided by the second SAW filter.

As shown in FIG. 19, the common midpoint grounded portions of the SAW filters 1 and 1A are mutually connected by common connection of the first connecting lines 11 and 11A.

In this preferred embodiment, however, the unbalanced-side grounded portions 12 and 12A are not mutually connected unlike in the fourth preferred embodiment.

Figure 20:
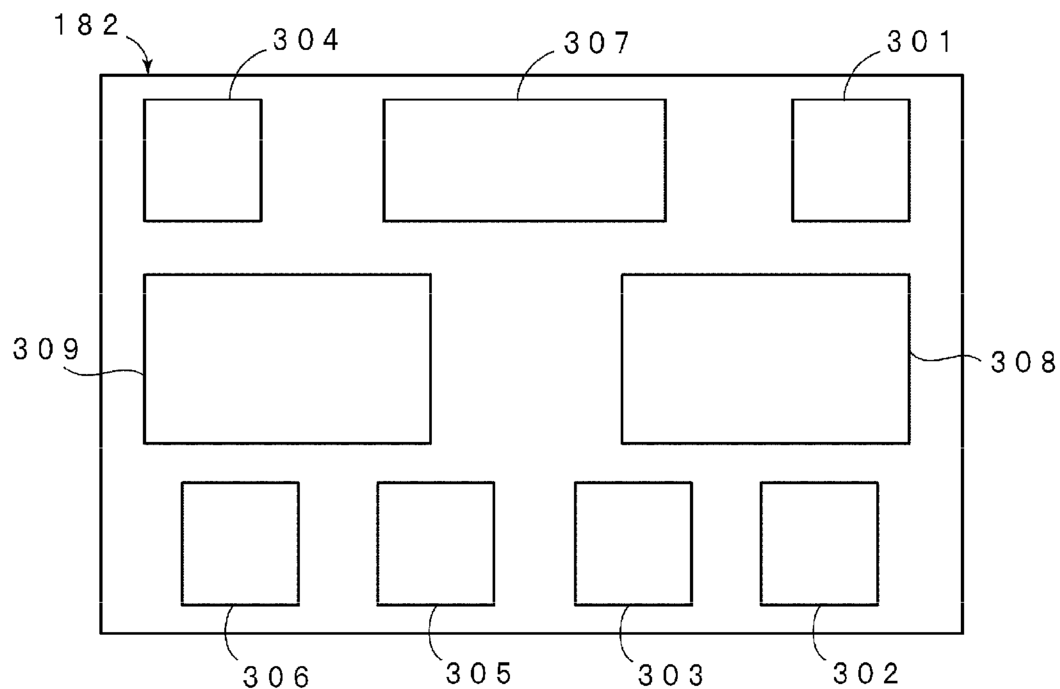
FIG. 20 is a plan view illustrating electrode lands on a package substrate as a package used in the sixth preferred embodiment of the present invention.

In this preferred embodiment, the above-described SAW filter chip 181 is mounted on a package substrate 182 as a package shown in FIG. 20. The package substrate 182 shown in the plan view in FIG. 20 is provided with a plurality of electrode lands 301 to 309 to which various electric connecting portions of the SAW filter chip 181 are attached by bumps. Herein, the electrode lands 308 and 309 correspond to second and third electrode lands to which the unbalanced-side grounded portions 12 and 12A of the SAW filter chip 181 are attached by bumps, and the electrode land 307 corresponds to an electrode land to which the common midpoint grounded portion is attached by a bump. In this preferred embodiment, the first to third electrode lands 307 to 309 are separated from each other.

Figure 22:
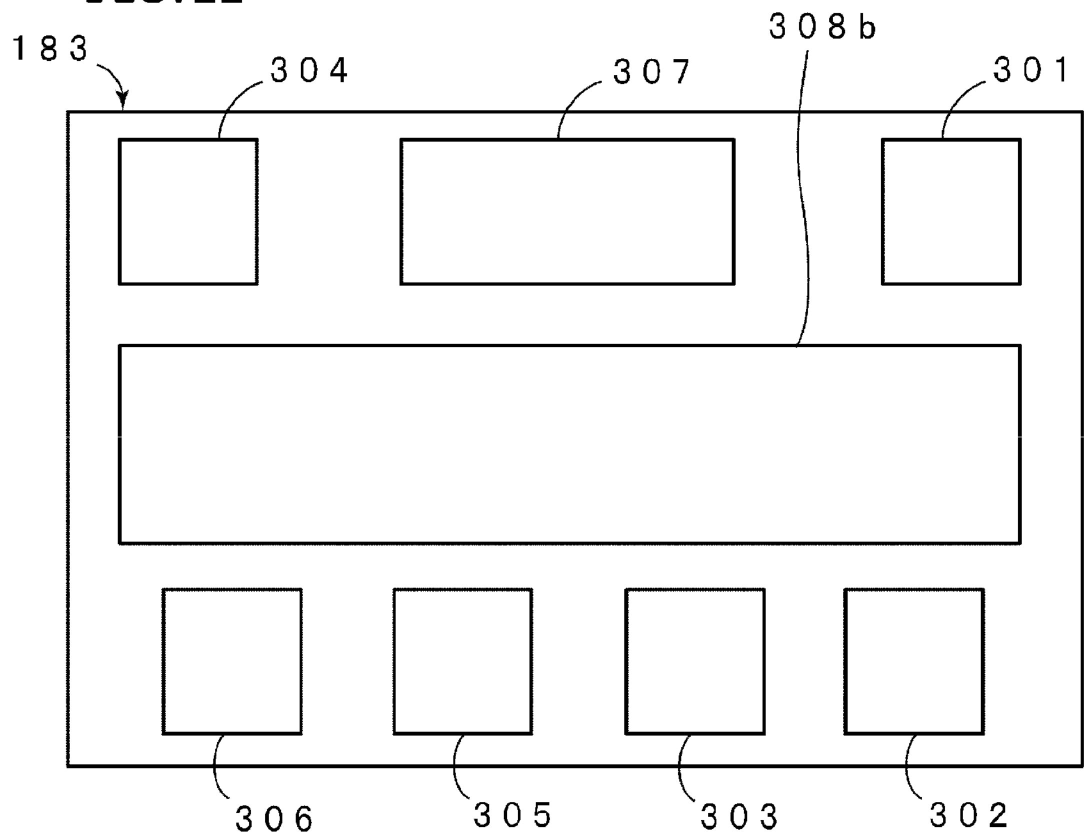
FIG. 22 is a schematic plan view illustrating electrode lands on an upper surface of a package substrate used in the acoustic wave device according to the reference example.

As a reference example, the above-described SAW filter chip was mounted on a package substrate shown in FIG. 22 by bumps so as to make an acoustic wave device according to the reference example. A package substrate 183 shown in FIG. 22 has the same configuration as that of the package substrate 182 except that the second and third electrode lands are integrated into an electrode land 308*b*. Thus, in the acoustic wave device according to the reference example, the unbalanced-side grounded portions 12 and 12A are not electrically separated on the package substrate.

Figure 21:
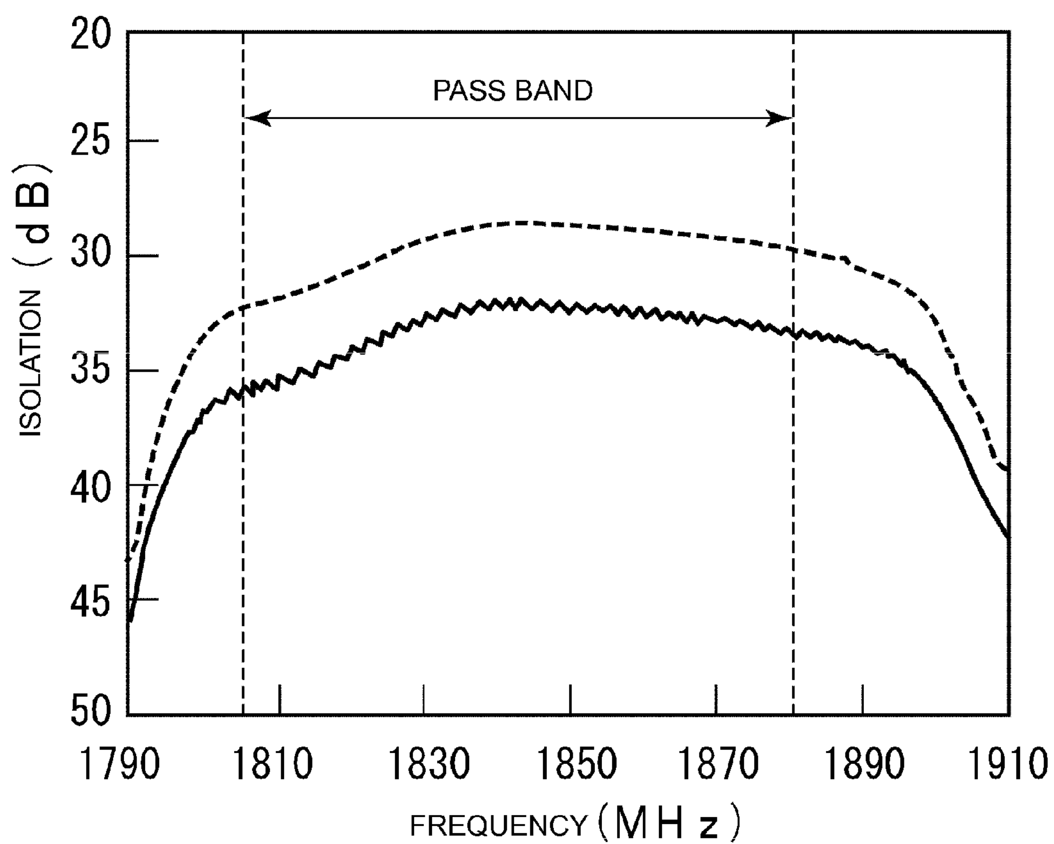
FIG. 21 shows isolation characteristics of the acoustic wave devices according to the sixth preferred embodiment of the present invention and a reference example.

Characteristics of isolation to frequency of the acoustic wave device according to the sixth preferred embodiment and the acoustic wave device according to the above-described reference example were measured. That is, a level (isolation) of a signal input from a second SAW filter as a PCS receiving filter output to a first SAW filter as a DCS receiving filter (a pass band of 1805 to 1880 MHz) was measured. The result is shown in FIG. 21. In FIG. 21, the solid line indicates the result of the sixth preferred embodiment and the broken line indicates the result of the reference example.

The isolation characteristic is improved as the attenuation is increased.

As shown in FIG. 21, the isolation characteristic is enhanced by separating the first to third electrode lands by using the package substrate 182.

As described above, in the present invention, a plurality of SAW filter elements configured in accordance with preferred embodiments of the present invention may be provided on a single SAW substrate, unbalanced-side grounded portions of the plurality of SAW filters may be separated from each other on the single SAW substrate, and electrode lands connected to the unbalanced-side grounded portions of the plurality of SAW filters may be separated from each other. With this configuration, since each SAW filter element is configured in accordance with the present invention, out-of-band attenuation is expanded and balance is improved, and also miniaturization is achieved. Furthermore, isolation among the plurality of SAW filter elements provided on the single SAW substrate is improved.

In the SAW filter chip 181 used in the sixth preferred embodiment, the common midpoint grounded portions 11 and 11A of the SAW filters 1 and 1A may be separated from each other, and the unbalanced-side grounded portions 12 and 12A may be separated from each other.

It has been verified that the isolation characteristic obtained when a SAW filter chip having such a configuration is mounted on the package substrate 181 is substantially the same as the isolation characteristic obtained in the sixth preferred embodiment.

In the first to fifth preferred embodiments, SAW filter elements and SAW filter devices using surface acoustic waves have been described. However, the present invention may be applied to a boundary acoustic wave filter or a boundary acoustic wave filter device using boundary acoustic waves.

Figure 23:
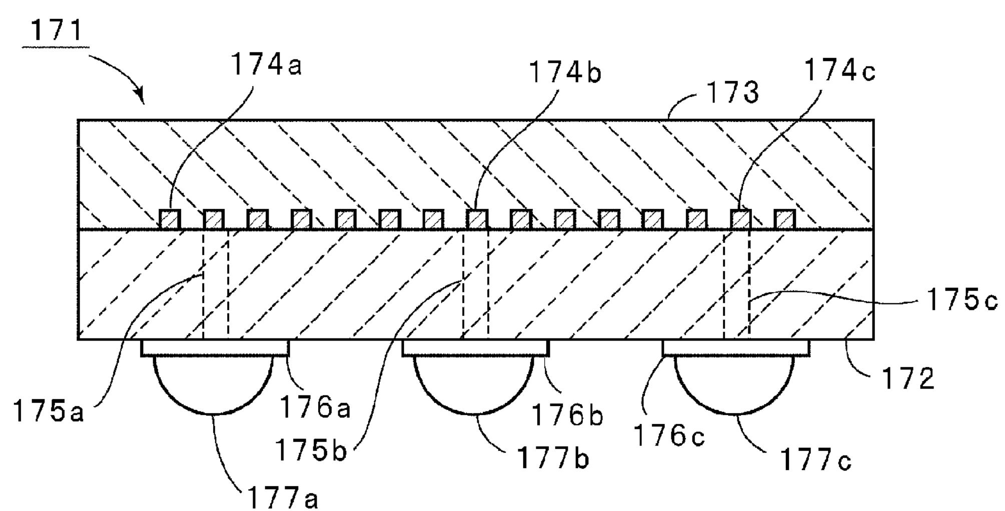
FIG. 23 is a schematic front cross-sectional view showing a boundary acoustic wave filter to which the present invention is applied.
Figure 24:
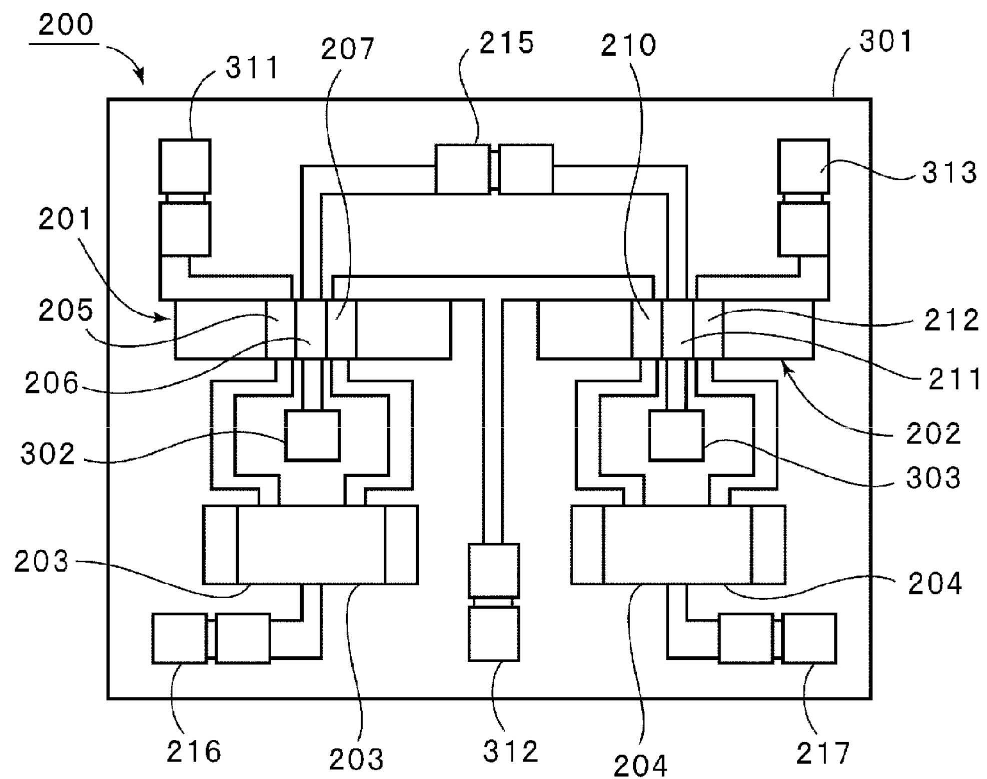
FIG. 24 is a schematic plan view showing an electrode configuration of a known SAW filter.
Figure 25:
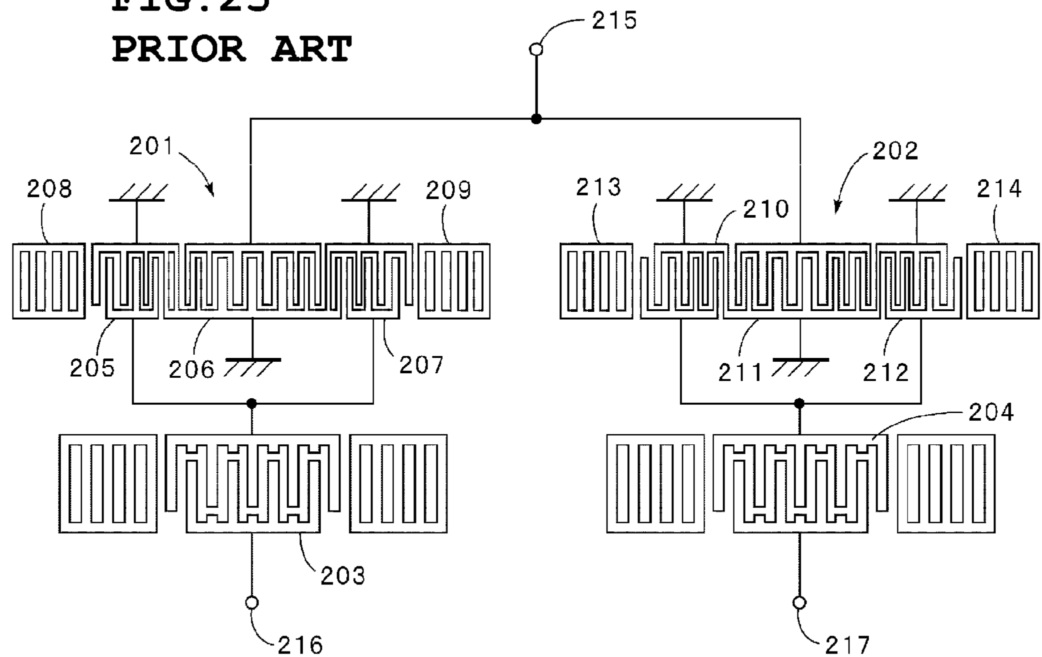
FIG. 25 is a schematic plan view showing a circuit configuration of the known SAW filter shown in FIG. 24.

FIG. 23 is a front cross-sectional view schematically showing an example of such a boundary acoustic wave filter. In the boundary acoustic wave filter 171, IDT electrodes 174*a* to 174*c* defining a filter are disposed at the boundary between a first medium layer 172 and a second medium layer 173. Through-hole electrodes 175*a* to 175*c* enable the IDT electrodes 174*a* to 174*c* to be connected to electrode pads 176*a* to 176*c* disposed on a lower surface of the medium layer 172.

Bumps 177*a* to 177*c* are attached to the electrode pads 176*a* to 176*c*.

In this boundary acoustic wave filer 171, an electrode configuration similar to that in the above-described first to fifth preferred embodiments is obtained by using the IDT electrodes 174*a* to 174*c*, so that a boundary wave filter having a balance-unbalance converting function is provided. As in the first to fifth preferred embodiments, by providing a common midpoint grounded portion and an unbalanced-side grounded portion on the boundary acoustic wave filter 171, out-of-band attenuation is expanded, balance is improved, and miniaturization is achieved.

In the boundary acoustic wave filter 171, vibration is confined between the first and second medium layers 172 and 173, and the lower surface of the second medium layer 172 is a mounted surface. Therefore, the boundary acoustic wave filter 171 is directly mounted on a circuit board, not on a package, by using the bumps 177*a* to 177*c*. That is, since a package having a cavity is not required, the boundary acoustic wave filter 171 can be mounted on a circuit board of an apparatus to be directly incorporated by using the bumps 177*a* to 177*c*. In this case, a ground electrode need not be shared on the circuit board, so that the incorporated apparatus is further miniaturized.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced acoustic wave filter including an unbalanced terminal and first and second balanced terminals, the filter comprising:

an acoustic wave substrate;

a first longitudinally-coupled filter element disposed on the acoustic wave substrate and including at least three IDTs connected between the unbalanced terminal and the first balanced terminal;

a second longitudinally-coupled filter element disposed on the acoustic wave substrate and including at least three IDTs connected between the unbalanced terminal and the second balanced terminal through which a signal of an opposite phase to that in the first balanced terminal of the first filter element flows;

a first connecting line connecting a grounded end of the IDT connected to the first balanced terminal of the first filter element to a grounded end of the IDT connected to the second balanced terminal of the second filter element so as to define a common midpoint grounded portion and provided on the acoustic wave substrate; and a second connecting line connecting grounded ends of the IDTS connected to the unbalanced terminal in the first filter element to grounded ends of the IDTs connected to the unbalanced terminal in the second filter element so as to define an unbalanced-side grounded portion and provided on the acoustic wave substrate; wherein the common midpoint grounded portion and the unbalanced-side grounded portion are electrically separated from each other on the acoustic wave substrate.

2. The balanced acoustic wave filter according to claim 1, further comprising:

a third connecting line connecting the unbalanced terminal to at least one of the IDTs connected to the unbalanced terminal and crossing the first connecting line on the acoustic wave substrate; and interlayer insulating films disposed between the first and third connecting lines at intersections of the first and third connecting lines.

3. The balanced acoustic wave filter according to claim 1, further comprising:

a package; wherein the package includes a first electrode land connected to the common midpoint grounded portion by a bump and a second electrode land connected to the unbalanced-side grounded portion by a bump; and the first and second electrode lands are separated from each other on the package.

4. The balanced acoustic wave filter according to claim 1, wherein the acoustic wave is a surface acoustic wave.

5. An acoustic wave filter device, wherein:

a first balanced acoustic wave filter defining the balanced acoustic wave filter according to claim 1 and a second balanced acoustic wave filter defining the balanced acoustic wave filter according to claim 1 are disposed on an acoustic wave substrate;

a center frequency of the first balanced acoustic wave filter is different from a center frequency of the second balanced acoustic wave filter;

a common midpoint grounded portion of the first balanced acoustic wave filter and a common midpoint grounded portion of the second balanced acoustic wave filter are mutually connected;

an unbalanced-side grounded portion of the first balanced acoustic wave filter and an unbalanced-side grounded portion of the second balanced acoustic wave filter are mutually connected; and the mutually connected common midpoint grounded portions and the mutually connected unbalanced-side grounded portions are electrically separated from each other on the acoustic wave substrate.

6. The acoustic wave filter device according to claim 5, wherein the acoustic wave filter device is a duplexer or a multi-band filter.

7. An acoustic wave filter device, wherein:

a first balanced acoustic wave filter defining the balanced acoustic wave filter according to claim 1 and a second balanced acoustic wave filter defining the balanced acoustic wave filter according to claim 1 are disposed on an acoustic wave substrate;

a center frequency of the first balanced acoustic wave filter is different from a center frequency of the second balanced acoustic wave filter;

a common midpoint grounded portion of the first balanced acoustic wave filter and a common midpoint grounded portion of the second balanced acoustic wave filter are mutually connected;

the mutually connected common midpoint grounded portions, an unbalanced-side grounded portion of the first balanced acoustic wave filter, and an unbalanced-side grounded portion of the second balanced acoustic wave filter are electrically separated from each other on the acoustic wave substrate;

the acoustic wave filter device further comprises a package, the package including a first electrode land connected to the common midpoint grounded portion by a bump, a second electrode land connected to the unbalanced-side grounded portion of the first balanced acoustic wave filter by a bump, and a third electrode land connected to the unbalanced-side grounded portion of the second balanced acoustic wave filter by a bump; and the first electrode land, the second electrode land, and the third electrode land are separated from each other on the package.

8. The acoustic wave filter device according to claim 6, wherein the acoustic wave filter device is a duplexer or a multi-band filter.

9. A balanced acoustic wave filter comprising:

an acoustic wave substrate;

a first longitudinally-coupled filter element disposed on the acoustic wave substrate and including an unbalanced terminal, first and second balanced terminals, and at least three IDTs connected between the unbalanced terminal and the first and second balanced terminals;

a second longitudinally-coupled filter element including third and fourth balanced terminals connected to the first and second balanced terminals of the first filter element, fifth and sixth balanced terminals, and a plurality of IDTs connected between the third and fourth balanced terminals and the fifth and sixth balanced terminals;

a first connecting line connecting grounded ends of the IDTs connected to the first and second balanced terminals of the first filter element to grounded ends of the IDTs connected to the third and fourth balanced terminals of the second filter elements so as to define a common midpoint grounded portion, and being provided on the acoustic wave substrate;

a second connecting line connecting to the grounded end of the IDT connected to the unbalanced terminal of the first filter element and being provided on the acoustic a first longitudinally-coupled filter element disposed on the acoustic wave substrate and including an unbalanced terminal, first and second balanced terminals, and at least three IDTs connected between the unbalanced terminal and the first and second balanced terminals;

a second longitudinally-coupled filter element including third and fourth balanced terminals connected to the first and second balanced terminals of the second filter element, fifth and sixth balanced terminals, and a plurality of IDTs connected between the third and fourth balanced terminals and the fifth and sixth balanced terminals;

a first connecting line connecting grounded ends of the IDTs connected to the first and second balanced terminals of the first filter element to grounded ends of the IDTs connected to the third and fourth balanced terminals of the second filter elements so as to define a common midpoint grounded portion, and being provided on the acoustic wave substrate; and a second connecting line connecting to the grounded end of the IDT connected to the unbalanced terminal of the first filter element and being provided on the acoustic wave substrate so as to define an unbalanced-side grounded portion; wherein the common midpoint grounded portion and the unbalanced-side grounded portion are electrically separated from each other on the acoustic wave substrate;

the first and second balanced acoustic wave filters are disposed on an acoustic wave substrate;

a center frequency of the first balanced acoustic wave filter is different from a center frequency of the second balanced acoustic wave filter;

a common midpoint grounded portion of the first balanced acoustic wave filter and a common midpoint grounded portion of the second balanced acoustic wave filter are mutually connected; wave substrate so as to define an unbalanced-side grounded portion;

a third connecting line connecting the unbalanced terminal to at least one of the IDTs connected to the unbalanced terminal and crossing the first connecting line on the acoustic wave substrate; and interlayer insulating films disposed between the first and third connecting lines at intersections of the first and third connecting lines; wherein the common midpoint grounded portion and the unbalanced-side grounded portion are electrically separated from each other on the acoustic wave substrate.

10. The balanced acoustic wave filter according to claim 9, further comprising:

a package; wherein the package includes a first electrode land connected to the common midpoint grounded portion by a bump and a second electrode land connected to the unbalanced-side grounded portion by a bump; and the first and second electrode lands are separated from each other on the package.

11. The balanced acoustic wave filter according to claim 9, wherein the acoustic wave is a surface acoustic wave.

12. An acoustic wave filter device, comprising:

a first balanced acoustic wave filter; and a second balanced acoustic wave filter; wherein each of the first and second balanced acoustic wave filters comprises:

an unbalanced-side grounded portion of the first balanced acoustic wave filter and an unbalanced-side grounded portion of the second balanced acoustic wave filter are mutually connected; and the mutually connected common midpoint grounded portions and the mutually connected unbalanced-side grounded portions are electrically separated from each other on the acoustic wave substrate.

13. The acoustic wave filter device according to claim 12, wherein the acoustic wave filter device is a duplexer or a multi-band filter.

14. An acoustic wave filter device, comprising:

a first balanced acoustic wave filter; and a second balanced acoustic wave filter; wherein each of the first and second balanced acoustic wave filters comprises:

a first longitudinally-coupled filter element disposed on the acoustic wave substrate and including an unbalanced terminal, first and second balanced terminals, and at least three IDTs connected between the unbalanced terminal and the first and second balanced terminals;

a second longitudinally-coupled filter element including third and fourth balanced terminals connected to the first and second balanced terminals of the first filter element, fifth and sixth balanced terminals, and a plurality of IDTs connected between the third and fourth balanced terminals and the fifth and sixth balanced terminals;

a first connecting line connecting grounded ends of the IDTs connected to the first and second balanced terminals of the first filter element to grounded ends of the IDTs connected to the third and fourth balanced terminals of the second filter elements so as to define a common midpoint grounded portion, and being provided on the acoustic wave substrate; and a second connecting line connecting to the grounded end of the IDT connected to the unbalanced terminal of the first filter element and being provided on the acoustic wave substrate so as to define an unbalanced-side grounded portion; wherein the common midpoint grounded portion and the unbalanced-side grounded portion are electrically separated from each other on the acoustic wave substrate; wherein the first and second balanced acoustic wave filters are disposed on an acoustic wave substrate;

a center frequency of the first balanced acoustic wave filter is different from a center frequency of the second balanced acoustic wave filter;

a common midpoint grounded portion of the first balanced acoustic wave filter and a common midpoint grounded portion of the second balanced acoustic wave filter are mutually connected;

the mutually connected common midpoint grounded portions, an unbalanced-side grounded portion of the first balanced acoustic wave filter, and an unbalanced-side grounded portion of the second balanced acoustic wave filter are electrically separated from each other on the acoustic wave substrate;

the acoustic wave filter device further comprises a package, the package including a first electrode land connected to the common midpoint grounded portion by a bump, a second electrode land connected to the unbalanced-side grounded portion of the first balanced acoustic wave filter by a bump, and a third electrode land connected to the unbalanced-side grounded portion of the second balanced acoustic wave filter by a bump; and the first electrode land, the second electrode land, and the third electrode land are separated from each other on the package.

15. The acoustic wave filter device according to claim 14, wherein the acoustic wave filter device is a duplexer or a multi-band filter.

* * * * *